US012219770B2

(12) United States Patent
Huang et al.

(10) Patent No.: US 12,219,770 B2
(45) Date of Patent: Feb. 4, 2025

(54) INTEGRATED CHIP WITH A GATE STRUCTURE DISPOSED WITHIN A TRENCH

(71) Applicant: Taiwan Semiconductor Manufacturing Company, Ltd., Hsinchu (TW)

(72) Inventors: Yong-Sheng Huang, Taipei (TW); Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/335,168

(22) Filed: Jun. 15, 2023

(65) Prior Publication Data

US 2023/0345728 A1    Oct. 26, 2023

Related U.S. Application Data

(62) Division of application No. 17/459,184, filed on Aug. 27, 2021, now Pat. No. 11,723,207.

(51) Int. Cl.
*H10B 43/30* (2023.01)
*H01L 21/28* (2006.01)
(Continued)

(52) U.S. Cl.
CPC ......... *H10B 43/30* (2023.02); *H01L 29/0649* (2013.01); *H01L 29/0847* (2013.01); *H10B 41/30* (2023.02)

(58) Field of Classification Search
CPC .............. H01L 29/792; H01L 29/40117; H01L 29/0847; H01L 29/42352;
(Continued)

(56) References Cited

U.S. PATENT DOCUMENTS

| 6,124,608 | A | * | 9/2000 | Liu | H10B 41/30 |
| | | | | | 257/330 |
| 6,436,765 | B1 | * | 8/2002 | Liou | H01L 29/7883 |
| | | | | | 438/315 |

(Continued)

FOREIGN PATENT DOCUMENTS

| CN | 209544306 U | 10/2019 |
| CN | 113130627 A | 7/2021 |

OTHER PUBLICATIONS

Non-Final Office Action dated Dec. 12, 2022 for U.S. Appl. No. 17/459,184.

(Continued)

*Primary Examiner* — Sonya McCall-Shepard
(74) *Attorney, Agent, or Firm* — Eschweiler & Potashnik, LLC

(57) ABSTRACT

The present disclosure relates to an integrated chip comprising a substrate having a first pair of opposing sidewalls that define a trench. The trench extends into a front-side surface of the substrate. A first source/drain region is disposed along the front-side surface of the substrate. A second source/drain region is disposed along the front-side surface of the substrate. A gate structure is disposed within the trench and is arranged laterally between the first source/drain region and the second source/drain region. The gate structure fills the trench and extends along the first pair of opposing sidewalls to an upper surface of the substrate. A bottom surface of the gate structure is disposed below a bottom surface of the first source/drain region.

20 Claims, 15 Drawing Sheets

(51) Int. Cl.
  *H01L 29/06* (2006.01)
  *H01L 29/08* (2006.01)
  *H01L 29/423* (2006.01)
  *H01L 29/792* (2006.01)
  *H10B 41/30* (2023.01)
  *H10B 43/40* (2023.01)

(58) Field of Classification Search
  CPC ......... H01L 21/823842; H01L 29/4236; H01L 29/66621; H01L 29/7813; H10B 43/30; H10B 41/30; H10B 12/053; H10B 12/34; H10B 43/40
  See application file for complete search history.

(56) References Cited

U.S. PATENT DOCUMENTS

| | | |
|---|---|---|
| 7,651,916 B2 | 1/2010 | Li et al. |
| 9,583,499 B1* | 2/2017 | Zhu ................... H01L 21/32139 |
| 2010/0084732 A1 | 4/2010 | Seo |
| 2015/0214314 A1* | 7/2015 | Oh ........................ H01L 29/785 |
| | | 257/330 |
| 2020/0020799 A1 | 1/2020 | Ueda et al. |
| 2020/0219884 A1 | 7/2020 | Lee et al. |

OTHER PUBLICATIONS

Notice of Allowance dated Mar. 22, 2023 for U.S. Appl. No. 17/459,184.

\* cited by examiner

INTEGRATED CHIP WITH A GATE STRUCTURE DISPOSED WITHIN A TRENCH

REFERENCE TO RELATED APPLICATION

This Application is a Divisional of U.S. application Ser. No. 17/459,184, filed on Aug. 27, 2021, the contents of which are hereby incorporated by reference in their entirety.

BACKGROUND

Flash memory is an electronic non-volatile computer storage medium that can be electrically erased and reprogrammed quickly. It is used in a wide variety of electronic devices and equipment. Common types of flash memory cells include stacked gate memory cells and split gate memory cells. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
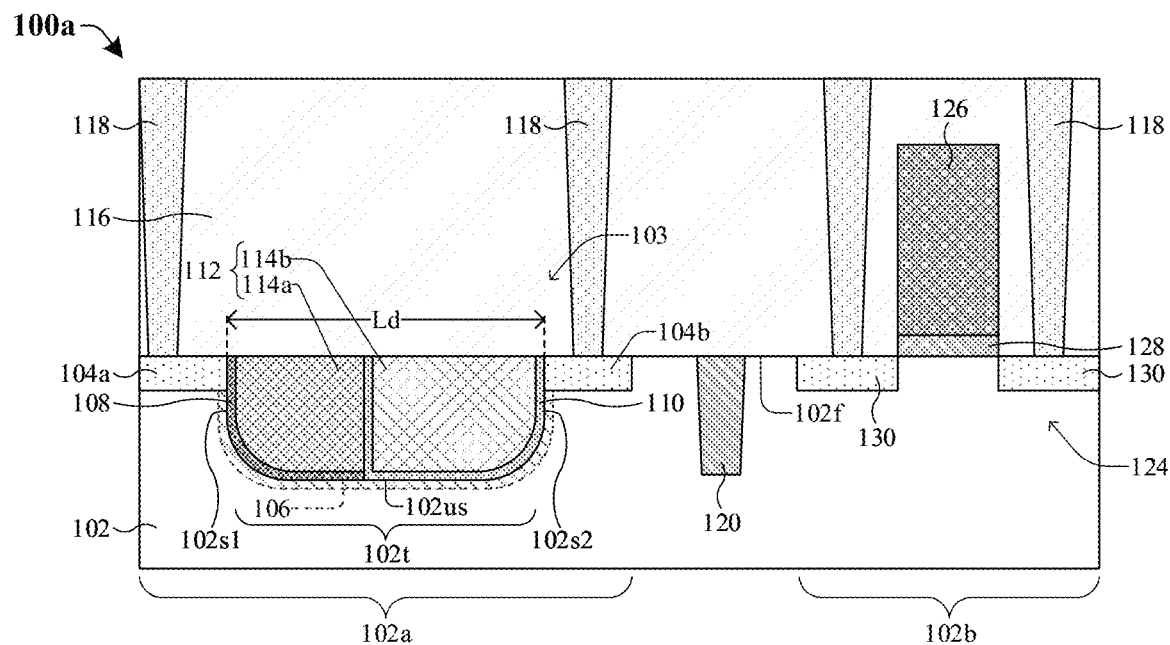
FIG. 1A illustrates a cross-sectional view of some embodiments of an integrated chip comprising a memory cell having a gate structure disposed within a trench of a substrate and a logic device disposed on the substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include memory cells disposed along a substrate. For example, an integrated chip may comprise a split-gate flash memory cell disposed along a substrate and disposed laterally within a memory region of the substrate. The memory cell includes a first source/drain region and a second source/drain region that are disposed along a horizontal top surface of a substrate and that are laterally separated from each other by a channel region of the substrate. A gate structure is disposed over the top surface of the substrate and is arranged between the first source/drain region and the second source/drain region. The gate structure includes a select gate and a memory gate that is laterally adjacent to the select gate. The select gate is vertically separated from the channel region by a select gate dielectric layer and the memory gate is vertically separated from the channel region by a charge trapping dielectric structure. A length of the channel region is proportional to a length of the top surface of the substrate that extends between the first and second source/drain regions. Further, the integrated chip may include a plurality of logic devices disposed within a logic region of the substrate that is directly adjacent to the memory region of the substrate. The logic devices may each comprise a logic gate disposed over the top surface of the substrate.

During fabrication of such an integrated chip, a select gate dielectric layer and a select gate are formed over the substrate within the memory region. A charge trapping dielectric structure is deposited over the substrate and a memory gate is deposited over the charge trapping dielectric structure. One or more photolithography processes are performed to pattern the memory gate and the charge trapping dielectric structure to align the memory gate with the select gate, thereby forming a gate structure over the substrate. Further, a dummy polysilicon structure is deposited over the gate structure within the memory region and over the logic region. A first etching process is performed on the dummy polysilicon structure within the logic region to expose the top surface of the substrate within the logic region, thereby resulting in a step height difference in a boundary region between the memory region and the logic region. A logic gate dielectric layer, logic polysilicon layer, and oxide layer are deposited over the memory region and logic region of the substrate. A second etching process is performed on the oxide layer and the logic polysilicon layer to reduce the step height difference between the memory and logic regions and facilitate formation of logic devices within the logic region. Subsequently, logic devices are formed within the logic region. By virtue of the select and memory gates being formed along the top surface of the substrate, extra processing steps (e.g., the first and second etching processes) are performed to reduce issues in regards to the boundary region (e.g., due to the step height difference) between the logic and memory regions. This increases a time and costs associated with forming the integrated chip.

Further, a challenge with such an integrated chip is that a cell density of the integrated chip may not be increased without diminishing a performance of the memory cell. For example, because the length of the channel region is proportionate to the length of the top surface of the substrate that extends between the first and second source/drain regions, reducing the length of the top surface of the substrate that extends between the first and second source/drain regions would benefit from reducing the length of the channel region. However, reducing the length of the channel region may negatively affect the performance of the memory cell. For example, memory cells with very short channel lengths may experience performance issues that are sometimes referred to as "short channel effects." Thus, the cell density of the integrated chip may not be increased without diminishing a performance of the memory cell.

Accordingly, various embodiments of the present disclosure are related to a method that simplifies fabrication of an integrated chip including a memory cell that comprises a gate structure embedded within a substrate and an associated structure that increases cell density of the integrated chip. A substrate includes a memory region laterally adjacent to a logic region. The method includes forming a first capping layer over a front-side surface of the substrate in the logic region. Subsequently, an etching process is performed on the front-side surface of the substrate in the memory region to form a trench that extends into the front-side surface. A gate structure including a select gate and a memory gate are formed within the trench, such that a bottom surface of the gate structure is disposed vertically below the front-side surface of the substrate. Further, a first source/drain region is formed within the substrate next to a first sidewall of the gate structure and a second source/drain region is formed within the substrate next to a second sidewall of the gate structure. Subsequently, the first capping layer is removed and a second capping layer is formed over the memory region of the substrate. A logic device is formed within the logic region of the substrate. By forming the gate structure within the trench, the extra processing steps utilized to reduce issues in regards to the boundary region between the logic region and the memory region may be omitted, thereby reducing time and costs associated with forming the integrated chip.

In addition, a channel region of the substrate extends along the gate structure from the first source/drain region to the second source/drain region. For example, the channel region extends vertically along both the first and second sidewalls of the gate structure and laterally along the bottom surface of the gate structure. This, in part, facilitates reducing a lateral distance between the first and second source/drain regions while a length of the channel region may be maintained and/or increased. For example, because portions of the channel region extend vertically along the first and second sidewalls of the gate structure, those portions of the channel region may add length to the channel region without adding to the lateral distance between the first and second source/drain regions. Thus, the length of the channel region is greater than the lateral distance between the first source/drain region and the second source/drain region. As a result, a number of memory cells disposed within a given lateral distance of the memory region may be increased without decreasing the lengths of the channel regions of the memory cells. Therefore, a cell density of the integrated chip may be increased without reducing a performance of the memory cells.

FIG. 1A illustrates a cross-sectional view of some embodiments of an integrated chip 100*a* comprising a gate structure 112 disposed within a trench 102*t* of a substrate 102.

The integrated chip 100*a* includes a substrate 102 having a memory region 102*a* laterally adjacent to a logic region 102*b*. An isolation structure 120 is disposed within the substrate 102 between the memory region 102*a* and the logic region 102*b*. A memory cell 103 is embedded within the substrate 102 and is disposed laterally within the memory region 102*a*. A logic device 124 is disposed on the substrate 102 and laterally within the logic region 102*b*. In various embodiments, the logic device 124 comprises a logic gate electrode 126, a logic gate dielectric layer 128, and a pair of source/drain regions 130 disposed on opposing sides of the logic gate electrode 126. The logic gate dielectric layer 128 is disposed between the logic gate electrode 126 and the substrate 102. In further embodiments, the integrated chip 100*a* further comprises an inter-level dielectric (ILD) layer 116 overlying the front-side surface 102*f* of the substrate and a plurality of conductive vias 118 extending through the ILD layer 116. The plurality of conductive vias 118 are electrically coupled to the memory cell 103 and the logic device 124.

The substrate 102 has a front-side surface 102*f* and an upper surface 102*us* disposed vertically below the front-side surface 102*f* of the substrate 102. Further, the substrate 102 comprises a first sidewall 102*s*1 and a second sidewall 102*s*2 that each continuously extend from the front-side surface 102*f* to the upper surface 102*us* of the substrate 102. The first sidewall 102*s*1 is opposite the second sidewall 102*s*2. The first sidewall 102*s*1, the second sidewall 102*s*2, and the upper surface 102*us* of the substrate 102 define the trench 102*t* extending into the front-side surface 102*f* of the substrate 102. The trench 102*t* is disposed laterally within the memory region 102*a* of the substrate 102. In various embodiments, the first and second sidewalls 102*s*1, 102*s*2 respectively comprise a straight sidewall segment vertically above a curved sidewall segment.

In some embodiments, the memory cell 103 comprises the gate structure 112, a first source/drain region 104*a*, and a second source/drain region 104*b*. The first and second source/drain regions 104*a*, 104*b* are each disposed along the front-side surface 102*f* of the substrate 102. The gate structure 112 is disposed within the trench 102*t* and laterally between the first source/drain region 104*a* and the second source/drain region 104*b*. The gate structure 112 comprises a first gate 114*a* and a second gate 114*b* that is laterally adjacent to the first gate 114*a*. In various embodiments, the first gate 114*a* extends from the front-side surface 102*f* of the substrate 102 to a point below the front-side surface 102*f*, and the second gate 114*b* extends from the front-side surface 102*f* of the substrate 102 to the point below the front-side surface 102*f*. Further, the first gate 114*a* is separated from the substrate 102 by a gate dielectric layer 108. In some embodiments, the gate dielectric layer 108 continuously extends along the first sidewall 102*s*1 of the substrate 102 to a first portion of the upper surface 102*us* of the substrate 102. The second gate 114*b* is separated from the substrate 102 and the first gate 114*a* by a charge trapping dielectric structure 110. In some embodiments, the charge trapping dielectric structure 110 continuously extends from the second sidewall 102*s*2 of the substrate, along a second portion of the upper surface 102*us* of the substrate 102, to a sidewall of the first gate 114a. In further embodiments, the charge trapping dielectric structure 110 laterally encloses the second gate 114b.

A channel region 106 extends along the gate structure 112 from the first source/drain region 104a to the second source/drain region 104b. In some embodiments, the channel region 106 extends vertically along both the first and second sidewalls 102s1, 102s2 of the substrate 102 and laterally along the upper surface 102us of the substrate 102. Because the channel region extends vertically along the first and second sidewalls 102s1, 102s2 of the substrate 102 and laterally along the upper surface 102us of the substrate 102, a length (not labeled) of the channel region 106 is greater than a lateral distance Ld between the first source/drain region 104a and the second source/drain region 104b. As a result, the lateral distance Ld between the first and second source/drain regions 104a, 104b may be reduced without reducing the length of the channel region 106. This, in part, increases a cell density of the integrated chip 100a without diminishing a performance of the memory cell 103.

In further embodiments, during fabrication of the integrated chip 100a a first capping layer (not shown) is formed over the logic region 102b and the trench 102t is formed within the memory region 102a. Subsequently, the gate structure 112 is formed within the trench 102t and the first and second source/drain regions 104a, 104b are formed on opposing sides of the gate structure 112. The first capping layer is removed, a second capping layer (not shown) is formed over the memory region 102a, and the logic device 124 is formed in the logic region 102b. The first and second capping layers (not shown) are configured to protect the substrate 102 and/or devices/structures within the memory region 102a and the logic region 102b during the fabrication of the integrated chip 100a. For example, the first capping layer is configured to prevent damage to the substrate 102 within the logic region 102b while forming the memory cell 103. In addition, by forming the gate structure 112 within the trench 102t, extra processing steps utilized to reduce issues in regards to the boundary region between the memory region 102a and the logic region 102b may be omitted, thereby reducing time and costs associated with the fabrication process.

In some embodiments, the first source/drain region 104a and the second source/drain region 104b may, for example, be or comprise doped regions of the substrate 102. In various embodiments, the first gate 114a and the second gate 114b may, for example, be or comprise polysilicon, a metal, or some other suitable material. Further, in some embodiments, the first gate 114a may, for example, be a select gate (SG) and the second gate 114b may, for example, be a memory gate (MG).

Figure 1B:
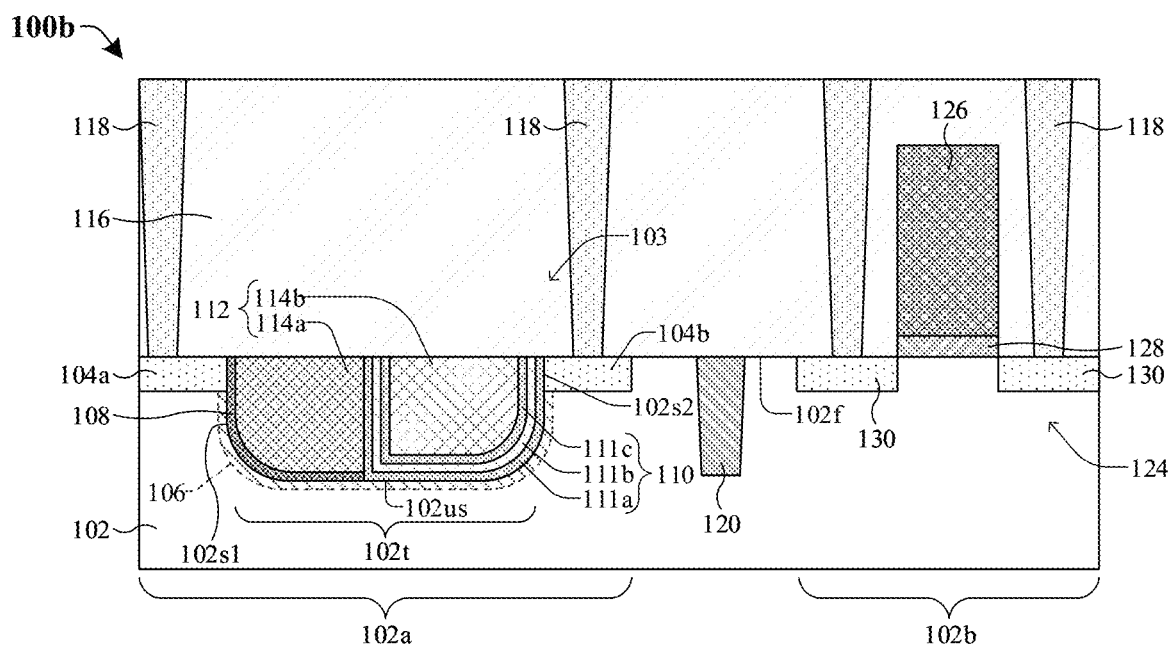
FIG. 1B illustrates a cross-sectional view of some alternative embodiments of an integrated chip comprising a memory cell having a gate structure disposed within a trench of a substrate and a logic device disposed on the substrate.

FIG. 1B illustrates a cross-sectional view of some embodiments of an integrated chip 100b corresponding to some alternative embodiments of the integrated chip 100a of FIG. 1A, in which the charge trapping dielectric structure 110 comprises a tunneling layer 111a, a charge trapping layer 111b, and a blocking layer 111c. In some embodiments, the tunneling layer 111a contacts the second sidewall 102s2 of the substrate 102, the second portion of the upper surface 102us of the substrate, and an outer sidewall of the first gate 114a. Further, the charge trapping layer 111b is disposed between the tunneling layer 111a and the blocking layer 111c. Furthermore, the blocking layer 111c is disposed between the charge trapping layer 111b and the second gate 114b. In various embodiments, the tunneling layer 111a and the blocking layer 111c may comprise a first dielectric material (e.g., silicon dioxide, aluminum oxide, or some other oxide) while the charge trapping layer 111b may comprise a second dielectric material (e.g., silicon nitride, aluminum nitride, or some other nitride) different from the first dielectric material.

Figure 2A:
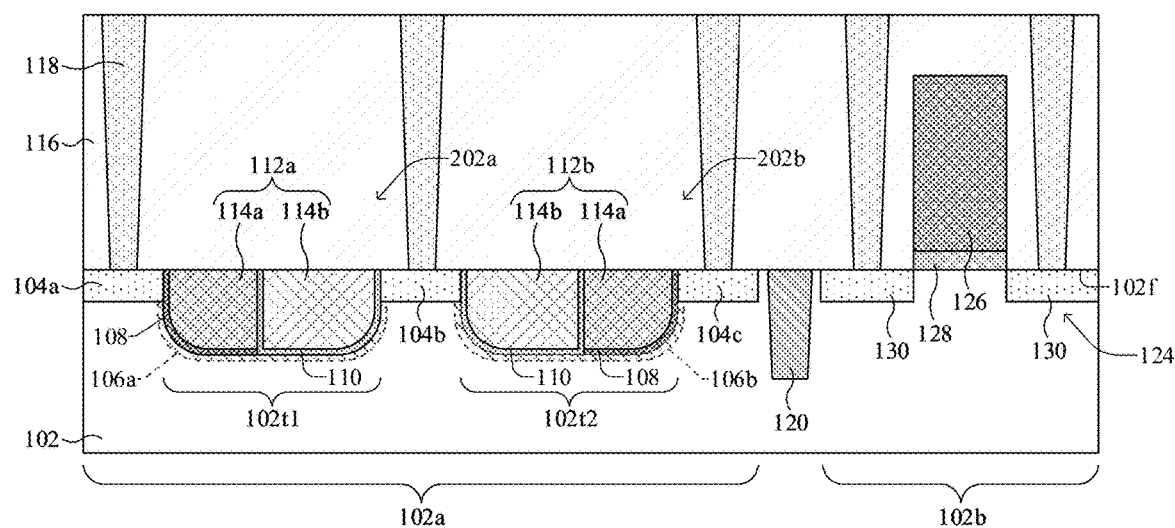
FIGS. 2A-2F illustrate various cross-sectional views of some embodiments of an integrated chip having gate structures disposed within trenches of a substrate and a logic device disposed on the substrate.

FIG. 2A illustrates a cross-sectional view of some embodiments of an integrated chip 200a comprising a first gate structure 112a disposed within a first trench 102t1 of a substrate 102 and a second gate structure 112b disposed within a second trench 102t2 of the substrate 102.

The integrated chip 200a includes a first memory cell 202a and a second memory cell 202b disposed laterally within a memory region 102a of the substrate 102. In various embodiments, the substrate 102 may, for example, be or comprise a bulk substrate (e.g., bulk silicon), a silicon-on-insulator (SOI) substrate, or another suitable substrate and/or may comprise a first doping type (e.g., p-type). Further, the substrate 102 comprises a first pair of opposing sidewalls that define the first trench 102t1 and a second pair of opposing sidewalls that define the second trench 102t2. The first trench 102t1 and the second trench 102t2 extend into a front-side surface 102f of the substrate 102 and are laterally offset from one another by a non-zero distance.

In various embodiments, the first memory cell 202a comprises a first source/drain region 104a that is disposed along the front-side surface 102f of the substrate 102. The second memory cell 202b comprises a third source/drain region 104c that is disposed along the front-side surface 102f of the substrate 102. Further, the first and second memory cells 202a-b share a second source/drain region 104b that is disposed laterally between the first and third source/drain regions 104a, 104c and is disposed along the front-side surface 102f of the substrate 102. In various embodiments, the second source/drain region 104b may be referred to as a common source/drain region. In further embodiments, the first memory cell 202a comprises the first gate structure 112a disposed laterally between the first and second source/drain regions 104a, 104b, and the second memory cell 202b comprises the second gate structure 112b disposed laterally between the second and third source/drain regions 104b, 104c. In various embodiments, the first, second, and third source/drain regions may comprise a second doping type (e.g., n-type) opposite the first doping type (e.g., p-type).

In some embodiments, the first gate structure 112a is disposed within the first trench 102t1 such that a top surface of the first gate structure 112a is vertically aligned with the front-side surface 102f of the substrate 102. In further embodiments, the first gate structure 112a is disposed within the first trench 102t1 such that the top surface of the first gate structure 112a is disposed vertically below the front-side surface 102f of the substrate 102 (not shown) (e.g., see FIG. 2E). In various embodiments, the second gate structure 112b is disposed within the second trench 102t2 such that a top surface of the second gate structure 112b is vertically aligned with the front-side surface 102f of the substrate. In yet further embodiments, the second gate structure 112b is disposed within the second trench 102t2 such that the top surface of the second gate structure 112b is disposed vertically below the front-side surface 102f of the substrate (not shown) (e.g., see FIG. 2E).

The first and second gate structures 112a, 112b respectively comprise a first gate 114a and a second gate 114b that is laterally adjacent to the first gate 114a. In various embodiments, the first and second gates 114a, 114b of the first gate structure 112a are disposed laterally between the first pair of opposing sidewalls of the substrate 102 that define the first trench 102t1. In further embodiments, the first and second gates 114a, 114b of the second gate structure 112b are disposed laterally between the second pair of opposing sidewalls of the substrate 102 that define the second trench 102t2. The first gate 114a is separated from the substrate 102 by a gate dielectric layer 108. In further embodiments, the second gate 114b is separated from the substrate and the first gate 114a by a charge trapping dielectric structure 110. In yet further embodiments, the charge trapping dielectric structure 110 extends from opposing sidewalls of the second gate 114b to a bottom surface of the second gate 114b. In some embodiments, the first gate 114a of the first gate structure 112a may be referred to as first select gate (SG), and the first gate 114a of the second gate structure 112b may be referred to as a second SG. In various embodiments, the second gate 114b of the first gate structure 112a may be referred to as a first memory gate (MG), and the second gate 114b of the second gate structure 112b may be referred to as a second MG. In yet further embodiments, the first and second memory cells 202a, 202b may each, for example, be configured as a two transistor (2T) silicon-oxide-nitride-oxide-silicon (SONOS) memory cell, a 2T metal-oxide-nitride-oxide-silicon (MONOS) memory cell, or the like.

In some embodiments, the gate dielectric layer 108 may, for example, be or comprise silicon dioxide, hafnium oxide, aluminum oxide, some other dielectric material, or any combination of the foregoing. The charge trapping dielectric structure 110 may comprise one or more dielectric layers. In further embodiments, the charge trapping dielectric structure 110 may be or comprise an oxide-nitride-oxide structure or some other suitable dielectric structure. For example, the charge trapping dielectric structure 110 may comprise a first dielectric layer, a second dielectric layer over the first dielectric layer, and a third dielectric layer over the second dielectric layer. In such embodiments, the first and third dielectric layers may comprise a first dielectric material while the second dielectric layer may comprise a second dielectric material different from the first dielectric material. In further embodiments, the first and second gates 114a, 114b of the first and second gate structures 112a, 112b may, for example, respectively be or comprise polysilicon, or another suitable material.

A first channel region 106a is disposed within the substrate 102 and extends along the first gate structure 112a from the first source/drain region 104a to the second source/drain region 104b. A second channel region 106b is disposed within the substrate 102 and extends along the second gate structure 112b from the second source/drain region 104b to the third source/drain region 104c. In various embodiments, a first length of the first channel region 106a is greater than a first lateral distance between the first source/drain region 104a and the second source/drain region 104b. In further embodiments, a second length of the second channel region 106b is greater than a second lateral distance between the second source/drain region 104b and the third source/drain region 104c. Thus, by virtue of the first and second gate structures 112a, 112b being disposed within the first and second trenches 102t1, 102t2, a cell density of the integrated chip 200a may be increased without diminishing a performance of the first and second memory cells 202a, 202b.

In various embodiments, during operation the first and second memory cells 202a, 202b can each be thought of as two transistors in series. Within each cell, one transistor is a MG transistor (e.g., corresponding to the second gate 114b), and the other is a SG transistor (e.g., corresponding to the first gate 114a) which may be controlled by a word line (not shown). Programming may be performed by means of source-side channel hot-electron injection. Poly-to-poly Fowler-Nordheim (FN) electron tunneling may be employed for erasing. In some embodiments, to change the cell value to a "0", a negative electrical potential is applied to both the MG and SG transistors, such that electrons stored in the charge trapping dielectric structure 110 are drained to a source/drain region of the memory cell. In further embodiments, the value of the cell can be changed to a "1" by the application of a strong positive electric field, which causes electrons passing through the channel region (e.g., 106a and/or 106b) of the transistors to tunnel into the charge trapping dielectric structure 110. Because the electrons tend to remain in the charge trapping dielectric structure 110 even when power is disconnected from the chip, the first and second memory cells 202a, 202b are said to be "non-volatile."

Further, an isolation structure 120 extends into the front-side surface 102f of the substrate 102 and is disposed between the memory region 102a and the logic region 102b. In various embodiments, the isolation structure 120 is configured to electrically isolate the memory cells 202a-b disposed within the memory region 102a from a logic device 124 disposed laterally within the logic region 102b. The isolation structure 120 may, for example, be configured as a shallow trench isolation (STI) structure. In some embodiments, the isolation structure 120 may, for example, be or comprise silicon dioxide, silicon nitride, silicon carbide, another suitable material, or any combination of the foregoing.

In various embodiments, the logic device 124 is configured as a transistor and comprises a logic gate dielectric layer 128, a logic gate electrode 126, and a pair of source/drain regions 130 disposed within the substrate 102. The logic gate electrode 126 is disposed over the front-side surface 102f of the substrate 102 and the logic gate dielectric layer 128 is disposed between the substrate 102 and the logic gate electrode 126. In further embodiments, the pair of source/drain regions 130 is disposed within the substrate 102 on opposing sides of the logic gate electrode 126. The source/drain regions 130 may each be a doped region of the substrate 102 and may comprise the second doping type (e.g., n-type). In some embodiments, the logic device 124 may be configured as a high-κ metal gate (HKMG). The logic gate electrode 126 may, for example, be or comprise one or more metals, such as titanium, aluminum, titanium nitride, tantalum nitride, another suitable material, or any combination of the foregoing. In various embodiments, the first and second gates 114a, 114b of the first and second gate structures 112a, 112b may comprise a first conductive material (e.g., polysilicon), and the logic gate electrode 126 may comprise a second conductive material (e.g., titanium, aluminum, titanium nitride, tantalum nitride, etc.) different from the first conductive material. In various embodiments, the logic gate dielectric layer 128 may, for example, be or comprise a high-κ dielectric material (e.g., a dielectric with a dielectric constant κ greater than about 3.9), aluminum oxide, hafnium oxide, silicon dioxide, another dielectric, or any combination of the foregoing. In various embodiments, a bottom surface of the logic gate electrode 126 is disposed vertically above the top surface of the first and second gates 114a, 114b.

In addition, an inter-level dielectric (ILD) layer 116 is disposed over the substrate 102 and extends continuously from the memory region 102a to the logic region 102b. In various embodiments, the ILD layer 116 comprises a low-κ dielectric material (e.g., a dielectric with a dielectric constant κ less than about 3.9), silicon dioxide, some other dielectric material, or any combination of the foregoing. A plurality of conductive vias 118 extend through the ILD layer 116. The conductive vias 118 are electrically coupled to the first and second memory cells 202a, 202b and the logic device 124. In various embodiments, the conductive vias 118 may, for example, be or comprise, titanium nitride, tantalum nitride, aluminum, copper, tungsten, ruthenium, some other metal material, or any combination of the foregoing.

Figure 2B:
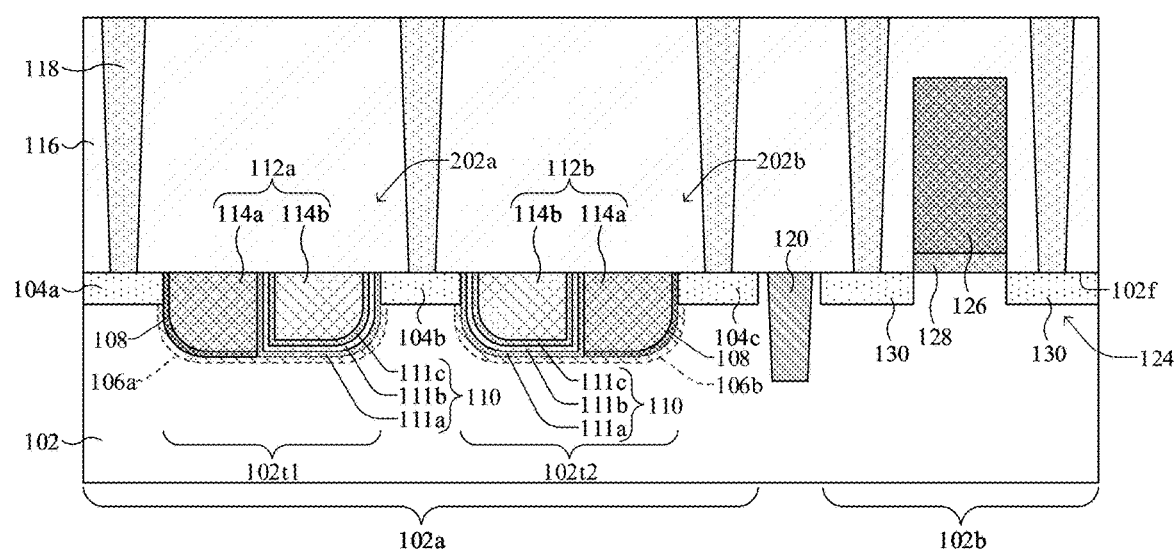

FIG. 2B illustrates a cross-sectional view of some embodiments of an integrated chip 200b corresponding to some alternative embodiments of the integrated chip 200a of FIG. 2A, in which the charge trapping dielectric structure 110 comprises a tunneling layer 111a, a charge trapping layer 111b, and a blocking layer 111c. In further embodiments, a bottom surface of the second gate 114b is disposed vertically between the front-side surface 102f of the substrate 102 and a bottom surface of the first gate 114a. In various embodiments, the tunneling layer 111a and the blocking layer 111c may comprise a first dielectric material (e.g., silicon dioxide, aluminum oxide, or some other oxide) while the charge trapping layer 111b may comprise a second dielectric material (e.g., silicon nitride, aluminum nitride, or some other nitride) different from the first dielectric material.

Figure 2C:
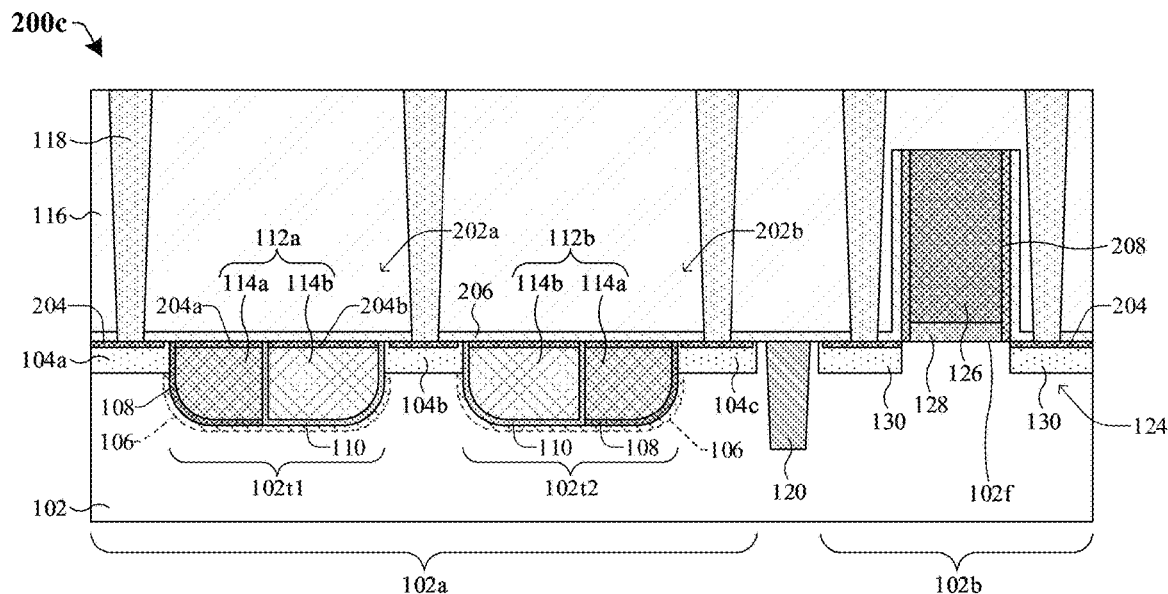

FIG. 2C illustrates a cross-sectional view of some embodiments of an integrated chip 200c corresponding to some alternative embodiments of the integrated chip 200a of FIG. 2A, in which the first and second gate structures 112a, 112b, the first, second, and third source/drain regions 104a, 104b, 104c, and the pair of source/drain regions 130 are covered by silicide layers 204. In various embodiments, the silicide layers 204 may, for example, be or comprise nickel silicide, titanium silicide, or the like. In yet further embodiments, a first silicide layer 204a overlying the first gate 114a is separated from a second silicide layer 204b overlying the second gate 114b by the charge trapping dielectric structure 110. Further, a contact etch stop layer (CESL) 206 is disposed between the ILD layer 116 and the front-side surface 102f of the substrate 102. In some embodiments, the CESL 206 may, for example, be or comprise silicon nitride, silicon carbide, silicon oxynitride, silicon oxycarbide, another dielectric material, or any combination of the foregoing. Further, a sidewall spacer 208 is disposed along opposing sidewalls of the logic gate dielectric layer 128 and along opposing sidewalls of the logic gate electrode 126.

Figure 2D:
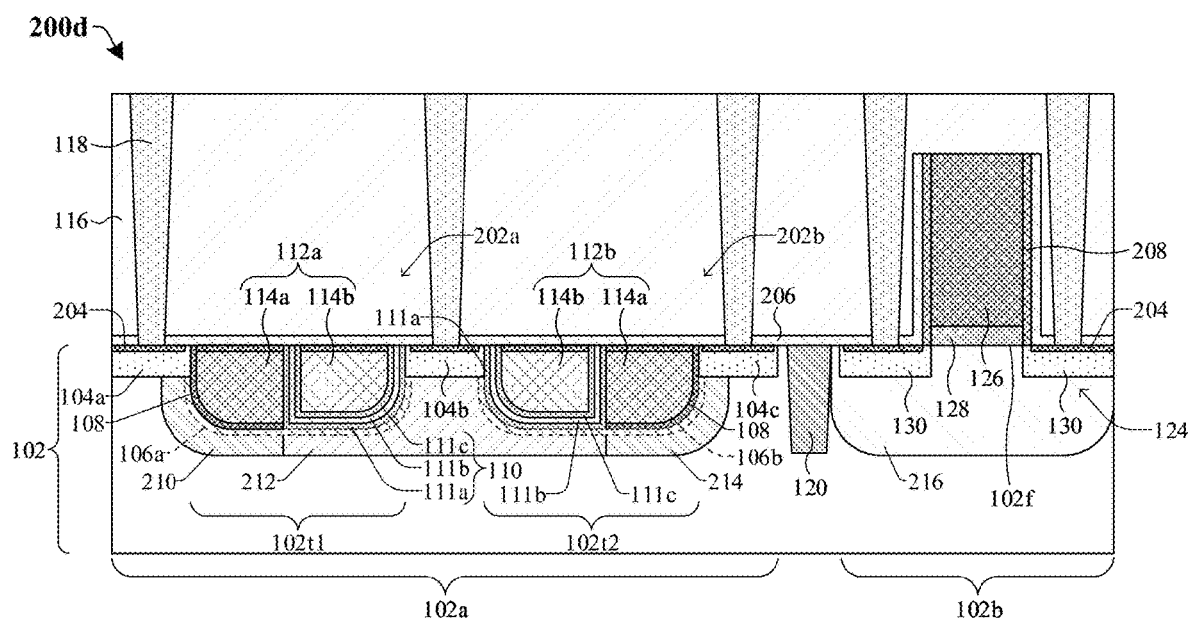

FIG. 2D illustrates a cross-sectional view of some embodiments of an integrated chip 200d corresponding to some alternative embodiments of the integrated chip 200a of FIG. 2A, in which a first well region 210, a second well region 212, a third well region 214, and a fourth well region 216 are disposed within the substrate 102. In some embodiments, the first well region 210 extends along the gate dielectric layer 108 of the first memory cell 202a to the first source/drain region 104a. In further embodiments, the second well region 212 extends along the charge trapping dielectric structure 110 of the first memory cell 202a to the charge trapping dielectric structure 110 of the second memory cell 202b. In yet further embodiments, the third well region 214 extends along the gate dielectric layer 108 of the second memory cell 202b to the third source/drain 104c. The fourth well region 216 is disposed below the logic gate electrode 126. In some embodiments, the first, third, and fourth well regions 210, 214, 216 comprise the first doping type (e.g., p-type) and have a doping concentration within a range of about $10^{14}$ to $10^{16}$ atoms per cubic centimeter (atoms/cm$^3$). In further embodiments, the second well region 212 comprise the first doping type (e.g., p-type) and has a doping concentration greater than about $10^{19}$ atoms/cm$^3$.

Figure 2E:
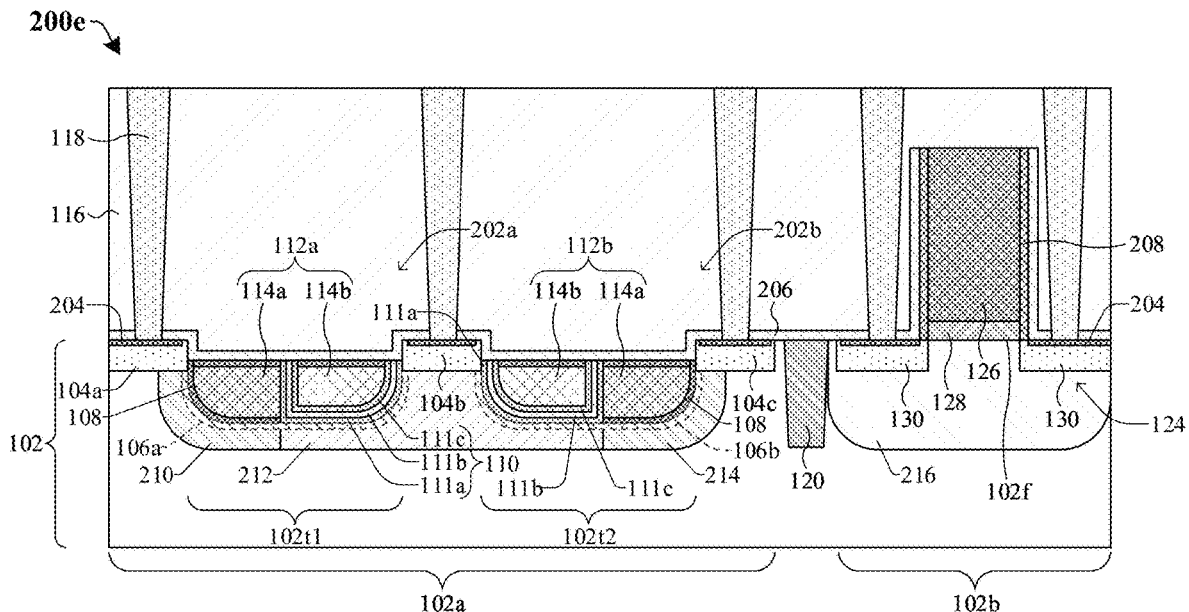

FIG. 2E illustrates a cross-sectional view of some embodiments of an integrated chip 200e corresponding to some alternative embodiments of the integrated chip 200a of FIG. 2A, in which top surfaces of the first and second gate structures 112a, 112b are disposed vertically below the front-side surface 102f of the substrate 102. In yet further embodiments, a top surface of the gate dielectric layer 108 is disposed vertically below the front-side surface 102f of the substrate 102, and a top surface of the charge trapping dielectric structure 110 is disposed vertically below the front-side surface 102f of the substrate 102.

Figure 2F:
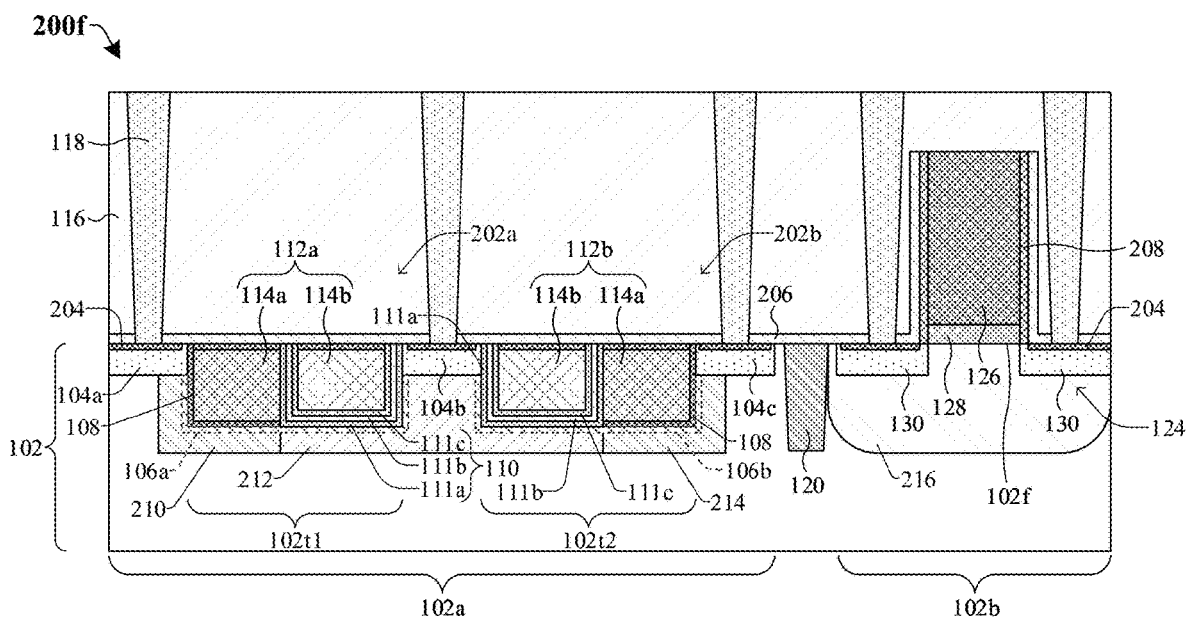

FIG. 2F illustrates a cross-sectional view of some embodiments of an integrated chip 200f corresponding to some alternative embodiments of the integrated chip 200a of FIG. 2A, in which the first and second gates 114a, 114b are respectively rectangular in shape.

FIGS. 3-19 illustrate cross-sectional views 300-1900 of some embodiments of a method of forming gate structures within trenches of a substrate according to the present disclosure. Although the cross-sectional views 300-1900 shown in FIGS. 3-19 are described with reference to a method, it will be appreciated that the structures shown in FIGS. 3-19 are not limited to the method but rather may stand alone separate of the method. Although FIGS. 3-19 are described as a series of acts, it will be appreciated that theses acts are not limiting in that the order of the acts can be altered in other embodiments, and the methods disclosed are also applicable to other structures. In other embodiments, some acts that are illustrated and/or described may be omitted in whole or in part.

Figure 3:
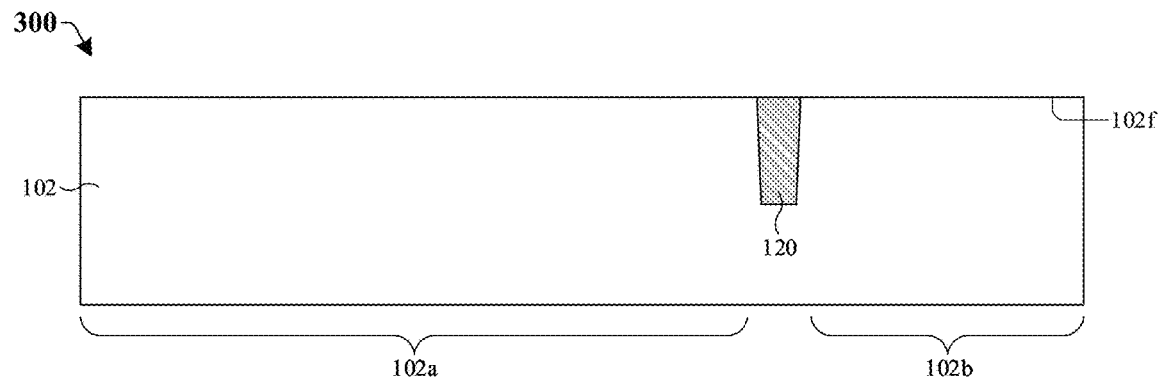
FIGS. 3-19 illustrate cross-sectional views of some embodiments of a first method for forming an integrated chip having gate structures disposed within trenches of a substrate and a logic device disposed on the substrate.

As shown in cross-sectional view 300 of FIG. 3, a substrate 102 is provided and an isolation structure 120 is formed extending into a front-side surface 102f of the substrate 102. In various embodiments, the substrate 102 comprises a memory region 102a and a logic region 102b laterally adjacent to the memory region 102a, such that the isolation structure 120 is disposed laterally between the memory region 102a and the logic region 102b. In some embodiments, a process for forming the isolation structure 120 includes: forming a masking layer (not shown) over the front-side surface 102f of the substrate 102; etching (e.g., a wet etch and/or a dry etch) the substrate 102 according to the masking layer to define an opening within the substrate 102; depositing (e.g., by a chemical vapor deposition (CVD) process, a physical vapor deposition (PVD) process, an atomic layer deposition (ALD) process, thermal oxidation, etc.) a dielectric layer filling the opening; performing a planarization process (e.g., a chemical mechanical planarization (CMP) process) into a top of the dielectric layer; and removing the masking layer. Other processes are, however, amenable for forming the isolation structure 120.

Figure 4:
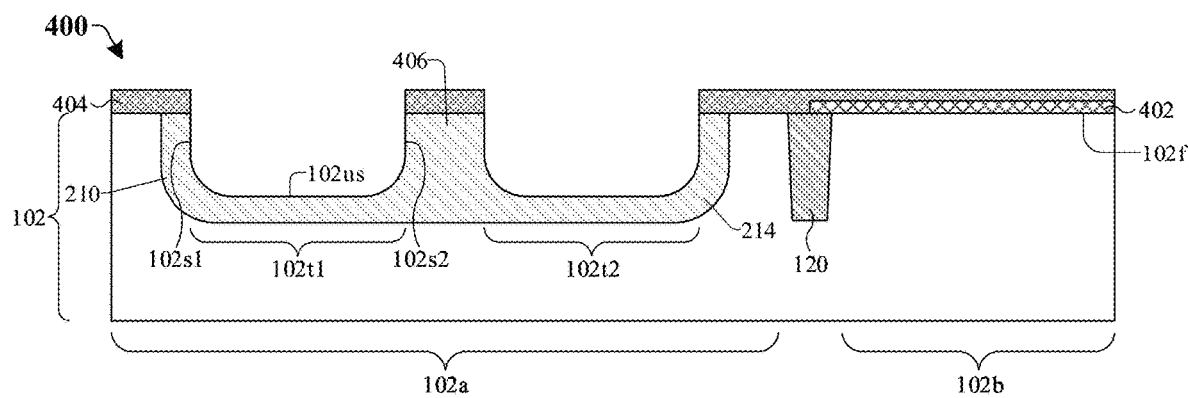

As shown in cross-sectional view 400 of FIG. 4, a first capping layer 402 is formed over the logic region 102b of the substrate 102. In some embodiments, the first capping layer 402 is laterally offset from the memory region 102a by a non-zero distance and is configured to prevent damage to the substrate 102 within the logic region 102b during subsequent processes performed on the memory region 102a. Further, a masking layer 404 is formed over the substrate 102, such that the masking layer 404 comprises two or more pairs of opposing sidewalls within the memory region 102a of the substrate 102. In further embodiments, a patterning process is performed on the front-side surface 102f of the substrate 102 to define a first trench 102t1 and a second trench 102t2. In some embodiments, the patterning process may include performing a dry etch process and/or a wet etch process on the substrate 102 according to the masking layer 404. Further, the substrate 102 comprises sidewalls that define the first and second trenches 102t1, 102t2. For example, the substrate 102 includes a first sidewall 102s1, a second sidewall 102s2, and an upper surface 102us that define the first trench 102t1. In various embodiments, the first and second sidewalls 102s1, 102s2 respectively comprise a straight sidewall segment overlying a curved sidewall segment. In yet further embodiments, after forming the first and second trenches 102t1, 102t2, a doped region 406 is formed within the substrate 102. In various embodiments, the doped region 406 may be formed by a selective ion implantation process and may include implanting dopants (e.g., boron, indium, or the like) having a first doping type (e.g., p-type) within the substrate 102 such that the doped region 406 has a doping concentration within a range of about $10^{14}$ to $10^{16}$ atoms/cm$^3$. In yet further embodiments, the doped region 406 includes a first well region 210 disposed around a first portion of the first trench 102t1 and a third well region 214 disposed around a first portion of the second trench 102t2.

In various embodiments, a process for forming the first capping layer 402 includes depositing the first capping layer 402 by a CVD process, a PVD process, an ALD process, an oxidation process, or another suitable deposition or growth process. The first capping layer 402 may, for example, be or comprise silicon dioxide, silicon nitride, silicon oxynitride, or the like. In various embodiments, the masking layer 404 may, for example, be or comprise silicon nitride, silicon oxynitride, or the like. In further embodiments, the first capping layer 402 may be part of the masking layer 404.

Figure 5:
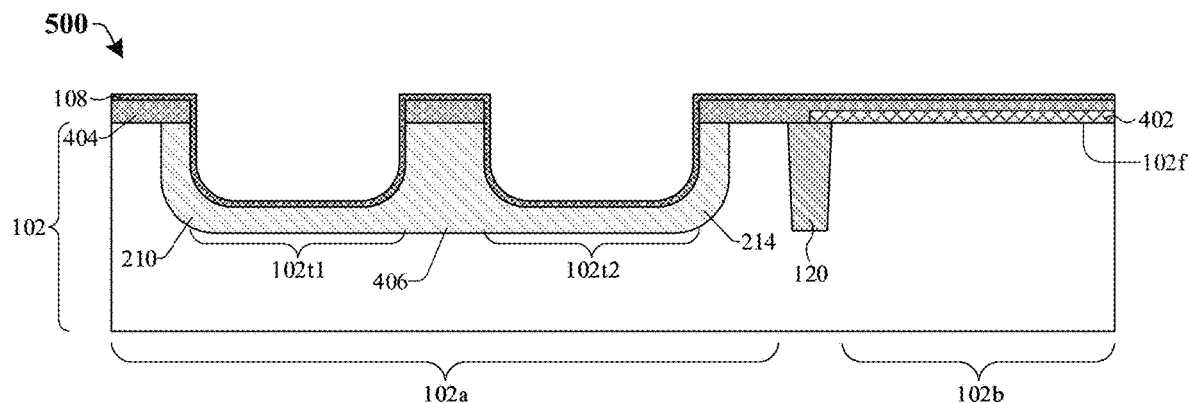

As shown in cross-sectional view 500 of FIG. 5, a gate dielectric layer 108 is formed over the substrate 102 such that the gate dielectric layer 108 lines the first trench 102t1 and the second trench 102t2. In some embodiments, a process for forming the gate dielectric layer 108 includes depositing the gate dielectric layer 108 over the substrate 102 by a CVD process, a PVD process, an ALD process, thermal oxidation, or another deposition or growth process.

Figure 6:
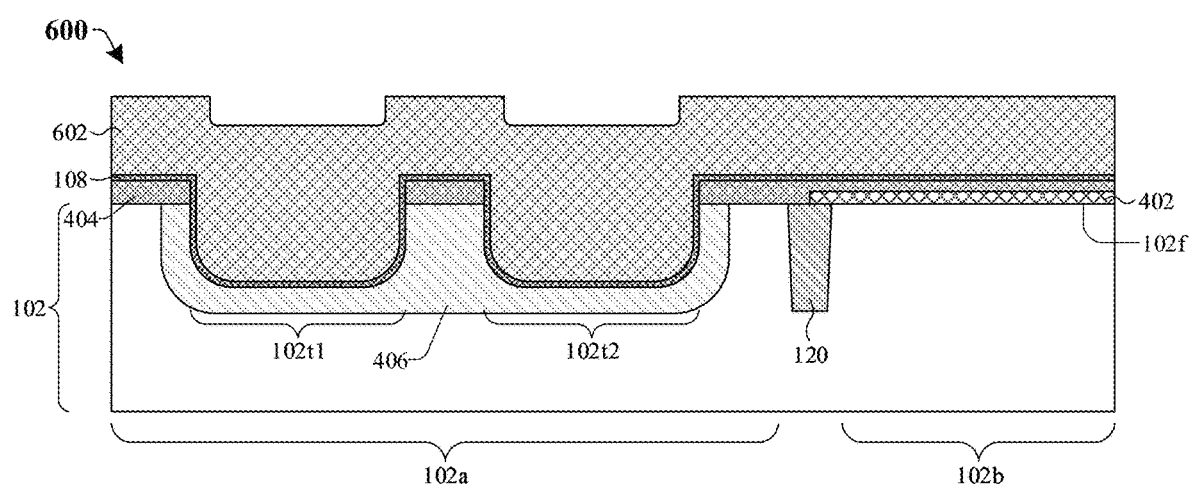

As shown in cross-sectional view 600 of FIG. 6, a first gate layer 602 is formed over the gate dielectric layer 108 and the substrate 102 such that the first gate layer 602 fills the first trench 102t1 and the second trench 102t2. In some embodiments, a process for forming the first gate layer 602 includes depositing the first gate layer 602 over the substrate 102 by a CVD process, a PVD process, an ALD process, or another suitable deposition or growth process. In yet further embodiments, the first gate layer 602 may, for example, be or comprise polysilicon or another suitable material.

Figure 7:
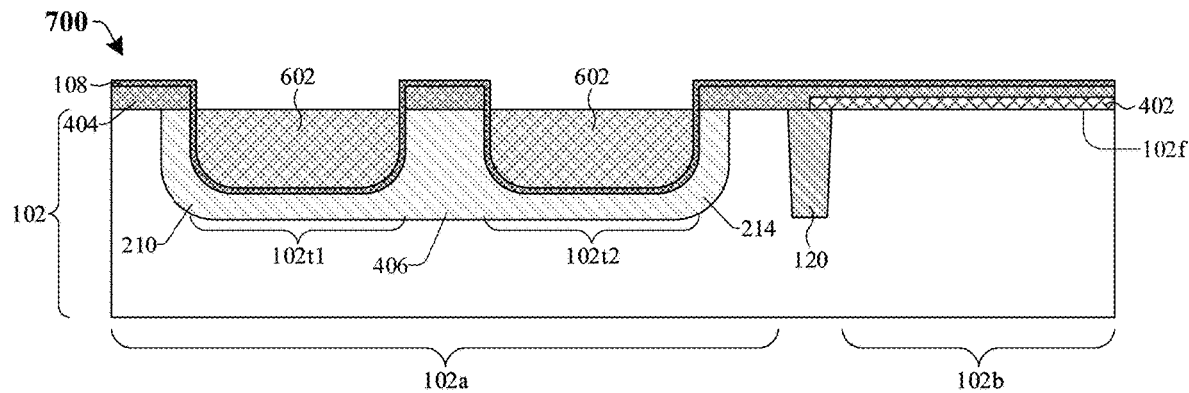

As shown in cross-sectional view 700 of FIG. 7, an etching process is performed on the first gate layer 602 to remove the first gate layer 602 from regions of the substrate 102 that are laterally offset from the first and second trenches 102t1, 102t2. In various embodiments, the etching process includes: forming a bottom anti-reflective coating (BARC) layer (not shown) over the substrate 102; and performing an etch back process on the BARC layer and the first gate layer 602 such that a top surface of the first gate layer 602 is vertically below a top surface of the masking layer 404. In yet further embodiments, the etch back process is performed such that the top surface of the first gate layer 602 is aligned with the front-side surface 102f of the substrate 102.

Figure 8:
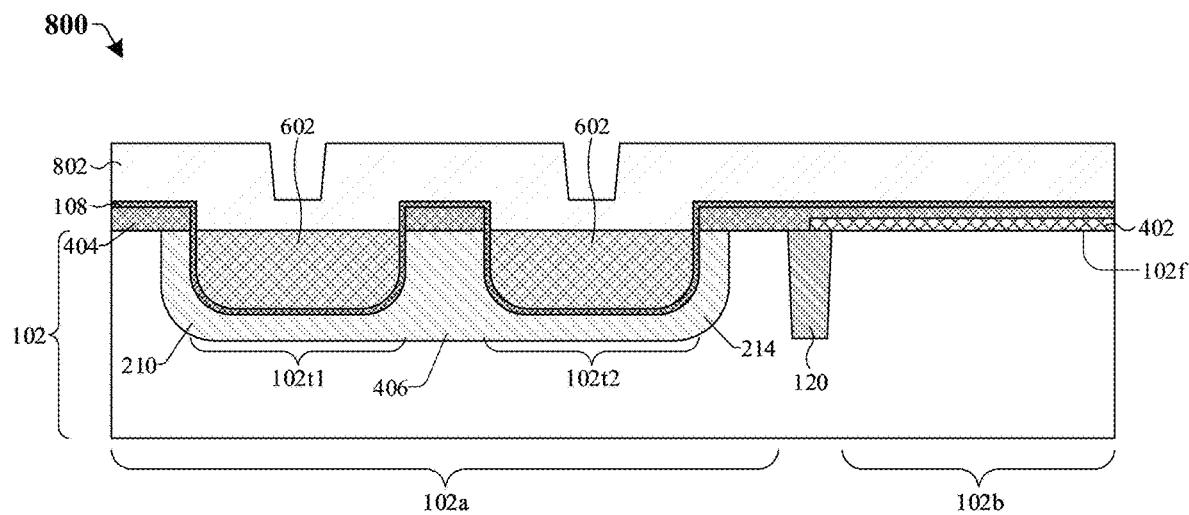

As shown in cross-sectional view 800 of FIG. 8, a dielectric layer 802 is formed over the substrate 102 and the first gate layer 602. In various embodiments, a process for forming the dielectric layer 802 includes depositing the dielectric layer 802 over the substrate 102 by a CVD process, a PVD process, an ALD process, or another suitable deposition or growth process. In various embodiments, the dielectric layer 802 may, for example, be or comprise an oxide such as silicon dioxide, or another suitable dielectric material.

Figure 9:
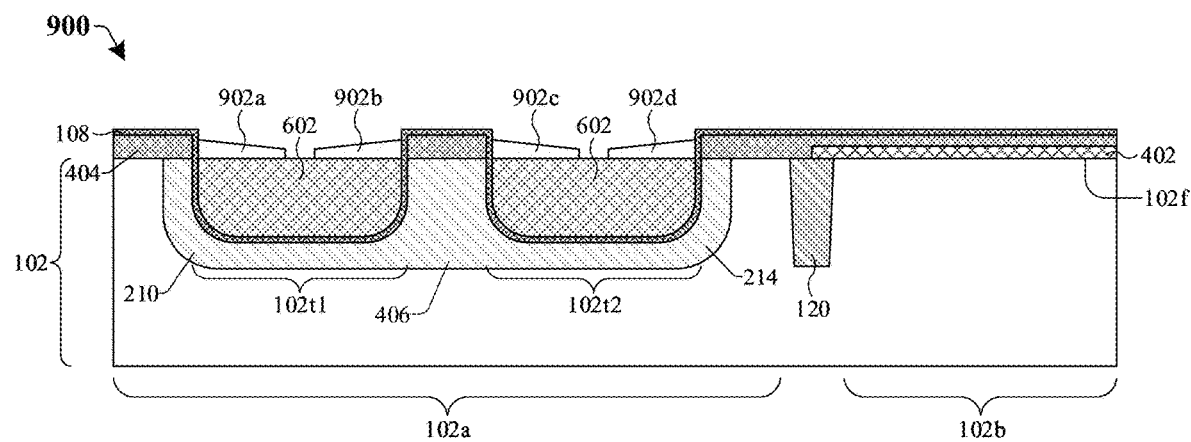

As shown in cross-sectional view 900 of FIG. 9, an etching process is performed on the dielectric layer (802 of FIG. 8), thereby forming a plurality of dielectric structures 902a-d over the first gate layer 602. In various embodiments, the etching process includes performing a dry etch and/or a wet etch. The plurality of dielectric structures 902a-d include a first dielectric structure 902a, a second dielectric structure 902b, a third dielectric structure 902c, and a fourth dielectric structure 902d. In some embodiments, the first and second dielectric structures 902a, 902b directly overlie the first gate layer 602 disposed within the first trench 102t1, and the third and fourth dielectric structures 902c, 902d directly overlie the first gate layer 602 disposed within the second trench 102t2.

Figure 10:
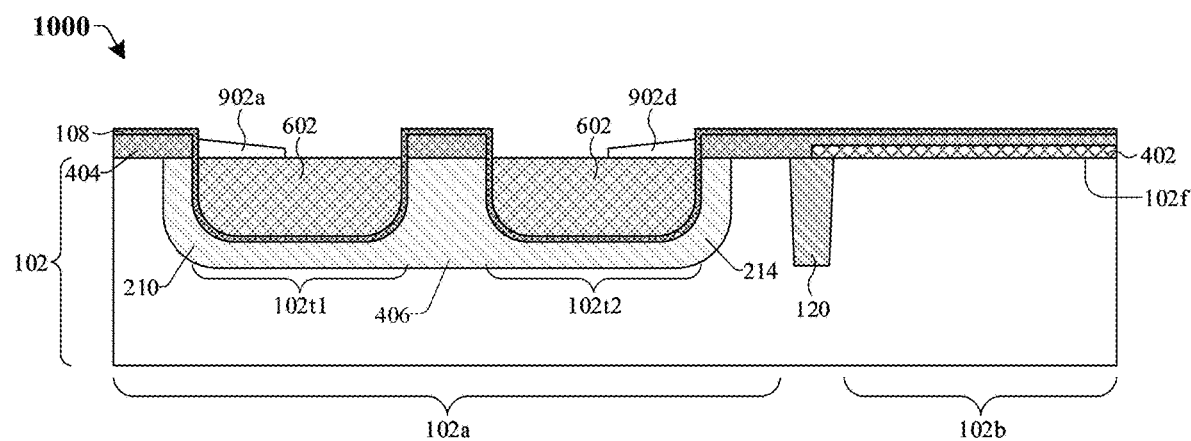

As shown in cross-sectional view 1000 of FIG. 10, a patterning process is performed to remove the second and third dielectric structures (902b, 902c of FIG. 9) from over the first gate layer 602. In various embodiments, the patterning process includes: forming a photomask layer (not shown) over the first and fourth dielectric structures 902a, 902d; and performing an etch process (e.g., a wet etch process and/or a dry etch process) according to the photomask layer to remove the second and third dielectric structures (902b, 902c of FIG. 9).

Figure 11:
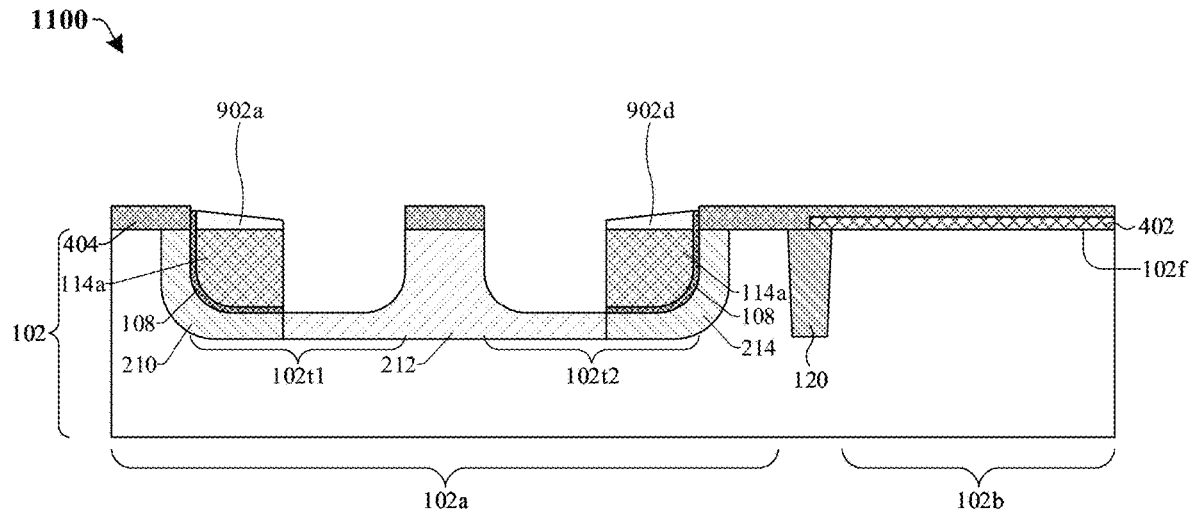

As shown in cross-sectional view 1100 of FIG. 11, an etching process is performed on the first gate layer (602 of FIG. 10), thereby defining first gates 114a within the first and second trenches 102t1, 102t2 of the substrate 102. In some embodiments, the etching process is performed according to the first and fourth dielectric structures 902a, 902d and removes segments of the gate dielectric layer 108 overlying the masking layer 404. Further, the etching process removes portions of the first gate layer (602 of FIG. 10) from regions of the first and second trenches 102t1, 102t2 that are laterally offset from the first and fourth dielectric structures 902a, 902d. In various embodiments, the etching process includes performing a wet etch process and/or a dry etch process. In various embodiments, a process for forming the first gates 114a includes the processing steps illustrated and/or described in FIGS. 6-11.

In yet further embodiments, an ion implantation process is performed to form a second well region 212 within the substrate and laterally between the first trench 102t1 and the second trench 102t2. The ion implantation process may, for example, include implanting dopants (e.g., boron, indium, or the like) having the first doping type (e.g., p-type) within the substrate 102 such that the second well region 212 has a doping concentration of $10^{19}$ atoms/cm$^3$ or greater.

Figure 12:
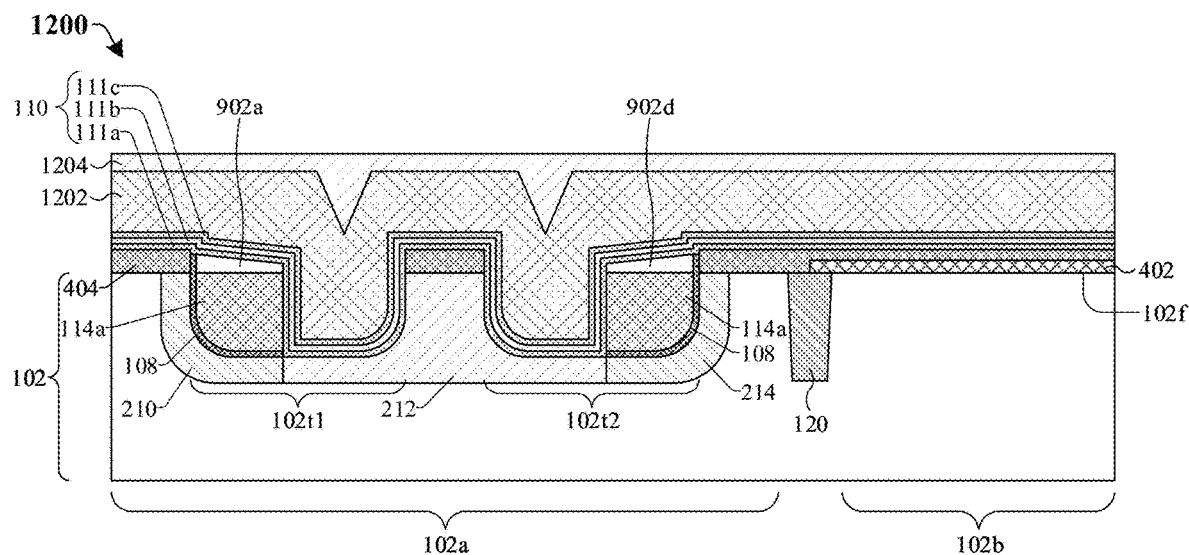

As shown in cross-sectional view 1200 of FIG. 12, a charge trapping dielectric structure 110 is formed over the substrate 102 such that the charge trapping dielectric structure 110 lines the first trench 102t1 and the second trench 102t2. A second gate layer 1202 is formed over the substrate 102 and fills the first trench 102t1 and the second trench 102t2. Further an upper BARC layer 1204 is formed over the second gate layer 1202. In various embodiments, the charge trapping dielectric structure 110 comprises a tunneling layer 111a, a charge trapping layer 111b, and a blocking layer 111c. In some embodiments, a process for forming the charge trapping dielectric structure 110 comprises: depositing (e.g., by CVD, PVD, ALD, or another suitable deposition or growth process) the tunneling layer 111a over the substrate 102 and lining the first and second trenches 102t1, 102t2; depositing (e.g., by CVD, PVD, ALD, or another suitable deposition or growth process) the charge trapping layer 111b over the tunneling layer 111a; and depositing (e.g., by CVD, PVD, ALD, or another suitable deposition or growth process) the blocking layer 111c over the charge trapping layer 111b. In further embodiments, a process for forming the second gate layer 1202 includes depositing the second gate layer 1202 over the charge trapping dielectric structure 110 by a CVD process, a PVD process, an ALD process, or another suitable deposition or growth process.

In various embodiments, the second gate layer 1202 may be or comprise polysilicon or another suitable material. In further embodiments, the second gate layer 1202 may comprise a same material (e.g., polysilicon) as the first gates 114a. In yet further embodiments, the tunneling layer 111a and the blocking layer 111c may comprise a first dielectric material (e.g., silicon dioxide, aluminum oxide, or some other oxide) while the charge trapping layer 111b may comprise a second dielectric material (e.g., silicon nitride, aluminum nitride, or some other nitride) different from the first dielectric material.

Figure 13:
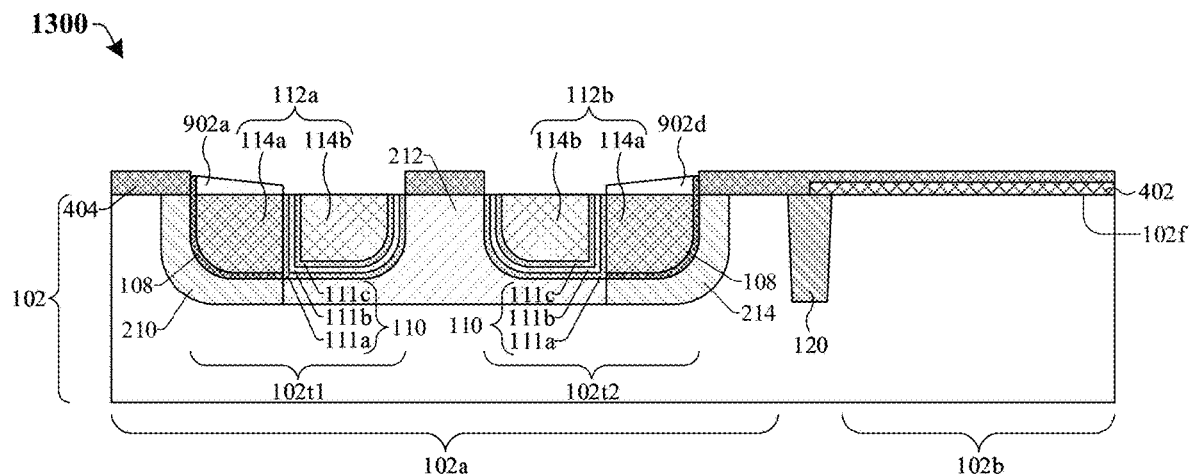

As shown in cross-sectional view 1300 of FIG. 13, a patterning process is performed on the second gate layer (1202 of FIG. 12), thereby defining second gates 114b within the first and second trenches 102t1, 102t2. In various embodiments, the patterning process defines a first gate structure 112a within the first trench 102t1 and a second gate structure 112b within the second trench 102t2, in which the first and second gate structures 112a, 112b respectively comprise the first gate 114a and the second gate 114b. In various embodiments, the patterning process includes: performing an etch back process on the second gate layer (1202 of FIG. 12), thereby defining the second gates 114b; and performing an etch process (e.g., a wet etch and/or dry etch) on the charge trapping dielectric structure 110. In some embodiments, the etch process removes portions of the charge trapping dielectric structure 110 overlying the masking layer 404. In yet further embodiments, a process for forming the first and second gate structures 112a, 112b includes the processing steps illustrated and/or described in FIGS. 6-13. In yet further embodiments, the patterning process is performed such that top surfaces of the second gates 114b are aligned with the front-side surface 102f of the substrate 102 and/or a top surface of the charge trapping dielectric structure 110 is aligned with the front-side surface 102f.

Figure 14:
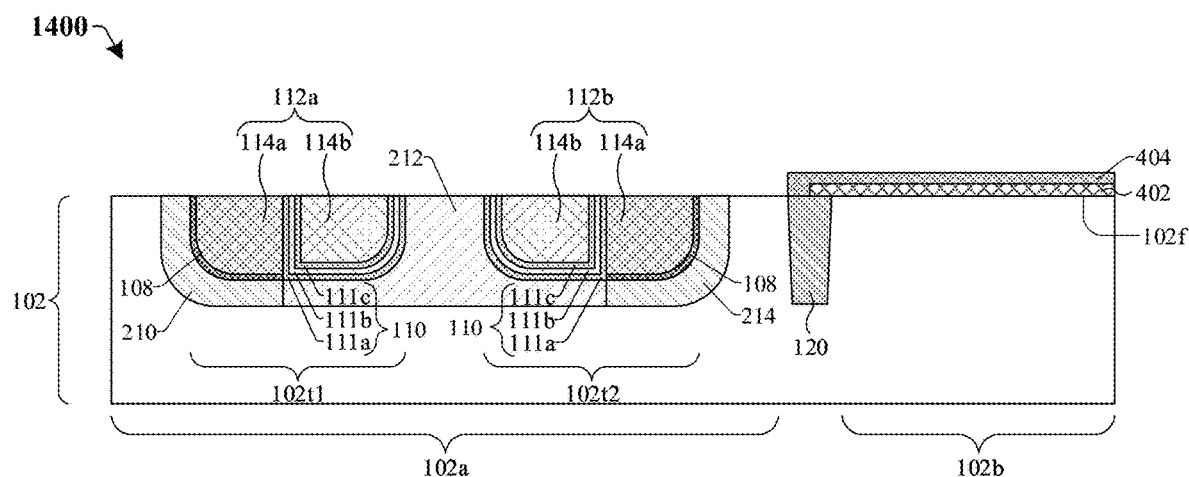

As shown in cross-sectional view 1400 of FIG. 14, a removal process is performed to remove the masking layer (404 of FIG. 13) and the first and fourth dielectric structures (902a, 902d of FIG. 13) from over the substrate 102 and laterally within the memory region 102a. In some embodiments, the removal process may include removing segments of the gate dielectric layer 108 vertically above the front-side surface 102f of the substrate 102. In various embodiments, the removal process may include performing a dry etch process, a wet etch process, a planarization process (e.g., a CMP process), or any combination of the foregoing.

Figure 15:
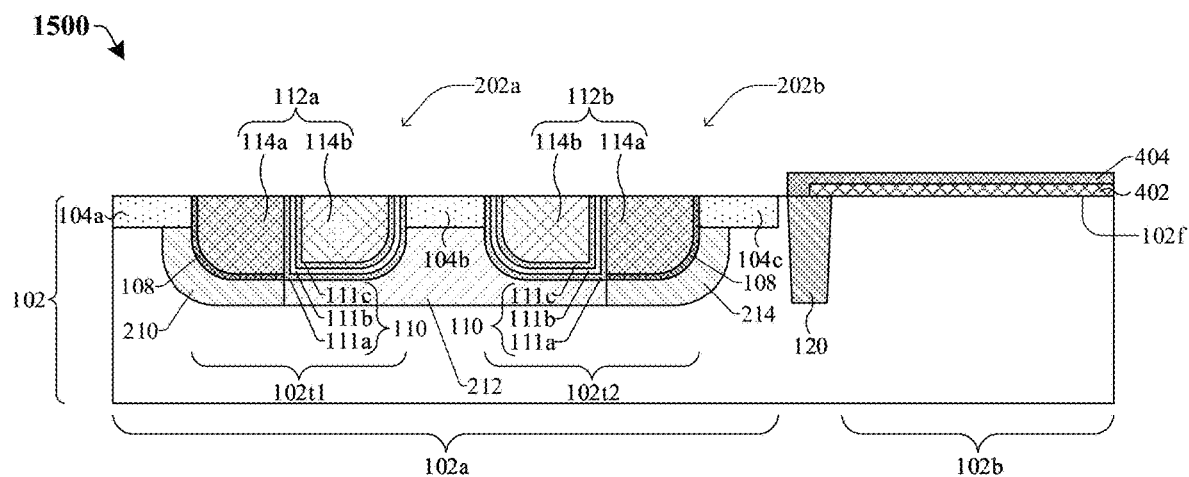

As shown in cross-sectional view 1500 of FIG. 15, a plurality of source/drain regions 104a-c is formed along the front-side surface 102f of the substrate 102, thereby defining a first memory cell 202a and a second memory cell 202b on the substrate 102. In some embodiments, the plurality of source/drain regions 104a-c includes a first source/drain region 104a disposed next to the first gate structure 112a, a second source/drain region 104b disposed laterally between the first gate structure 112a and the second gate structure 112b, and a third source/drain region 104c disposed next to the second gate structure 112b. In various embodiments, the plurality of source/drain regions 104a-c may, for example, be formed by an ion implantation process or another suitable process. In yet further embodiments, the plurality of source/drain regions 104a-c comprise a second doping type (e.g., n-type) opposite the first doping type (e.g., p-type).

In yet further embodiments, after forming the plurality of source/drain regions 104a-c, a removal process (not shown) is performed to remove the masking layer 404 and the first capping layer 402 from over the front-side surface 102f of the substrate 102. This, in part, exposes the front-side surface 102f of the substrate 102 in the logic region 102b. The removal process may include performing a wet etch process, a dry etch process, a planarization process (e.g., a CMP process), or any combination of the foregoing. In some embodiments, the removal process includes performing the planarization process (e.g., the CMP process) and may remove portions of the first and second gate structures 112a, 112b, portions of the charge trapping dielectric structure 110, and/or portions of the gate dielectric layer 108. In such embodiments, the planarization process facilitates the top surface of the first gate structure 112a, the top surface of the second gate structure 112b, the top surface of the charge trapping dielectric structure 110, and/or a top surface of the gate dielectric layer 108 each being coplanar with the front-side surface 102f of the substrate 102.

Figure 16:
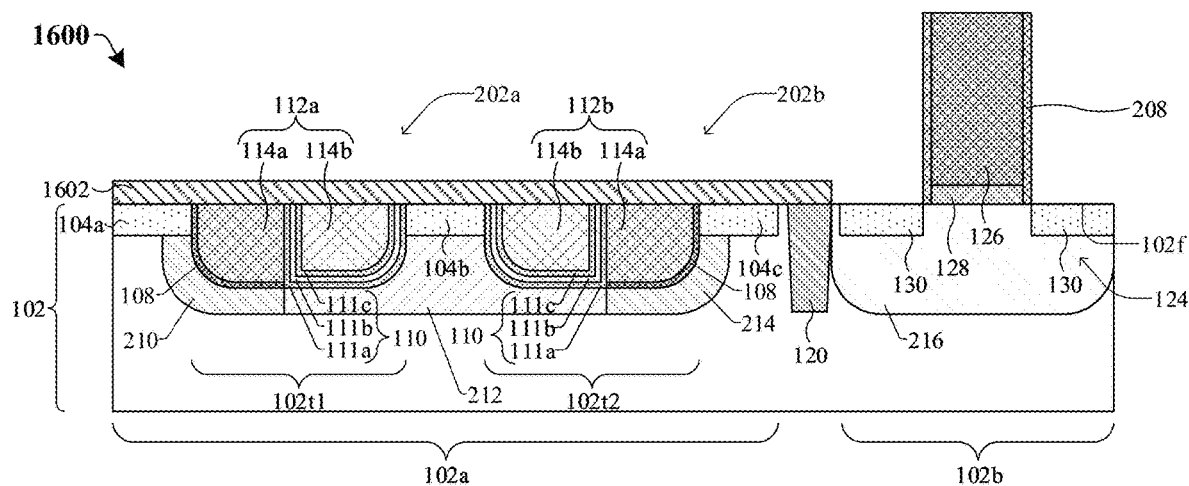

As shown in cross-sectional view 1600 of FIG. 16, a second capping layer 1602 is formed over the memory region 102a of the substrate 102. Subsequently, a logic device 124 is formed within the logic region 102b of the substrate 102. In various embodiments, a process for forming the second capping layer 1602 includes depositing the second capping layer 1602 by a CVD process, a PVD process, an ALD process, an oxidation process, or another suitable deposition or growth process. The second capping layer 1602 may, for example, be or comprise silicon dioxide, silicon nitride, silicon oxynitride, or the like. In some embodiments, a process for forming the logic device 124 comprises: forming a fourth well region 216 within the logic region 102b of the substrate 102; forming a logic gate dielectric layer 128 along the front-side surface 102f of the substrate 102; forming a logic gate electrode 126 over the logic gate dielectric layer 128; forming a sidewall spacer 208 along sidewalls of the logic gate dielectric layer 128 and along sidewalls of the logic gate electrode 126; and forming a pair of source/drain regions 130 along the front-side surface 102f of the substrate 102 and on opposing sides of the logic gate electrode 126. In yet further embodiments, after forming the logic device 124, a removal process (not shown) is performed to remove the second capping layer 1602 from over the memory region 102a of the substrate 102.

In various embodiments, the fourth well region 216 may be formed by an ion implantation process or another suitable formation process. In yet further embodiments, the logic gate dielectric layer 128 may be deposited by a CVD process, a PVD process, an ALD process, a thermal oxidation process, or another suitable growth or deposition process. In further embodiments, the logic gate electrode 126 may be deposited by a CVD process, a PVD process, a sputtering process, electroless plating, electroplating, or another suitable deposition or growth process. In yet further embodiments, by forming the first and second gate structures 112a, 112b within the first and second trenches 102t1, 102t2, extra processing steps utilized to reduce issues in regards to the region between the memory region 102a and the logic region 102b may be omitted, thereby reducing time and costs associated with manufacturing the integrated chip.

Figure 17:
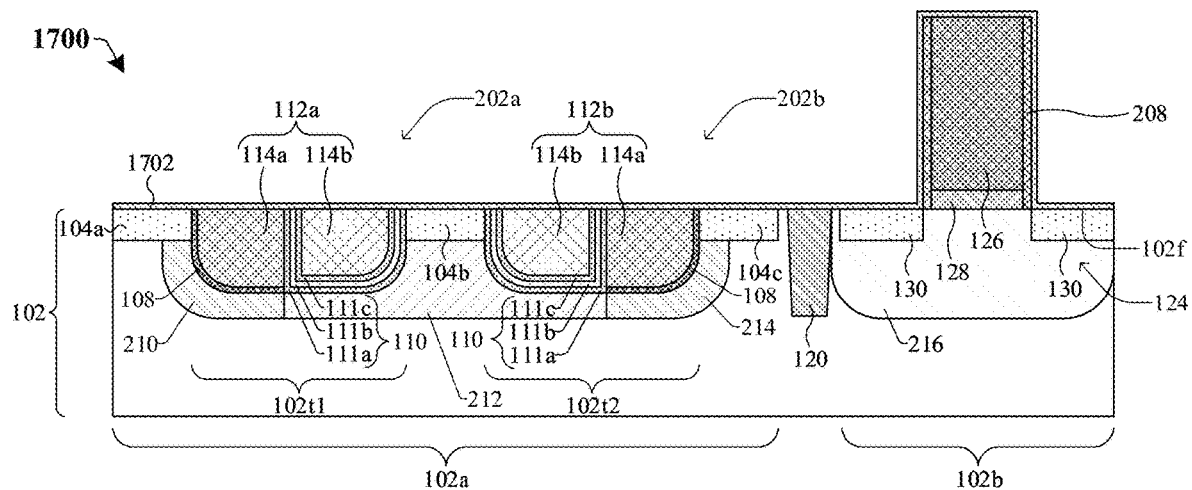

As shown in cross-sectional view 1700 of FIG. 17, a conductive layer 1702 is formed over the substrate 102 such that the conductive layer 1702 continuously extends from the memory region 102a to the logic region 102b. In some embodiments, the conductive layer 1702 may, for example, be or comprise nickel, platinum, palladium, cobalt, titanium, copper, or the like.

Figure 18:
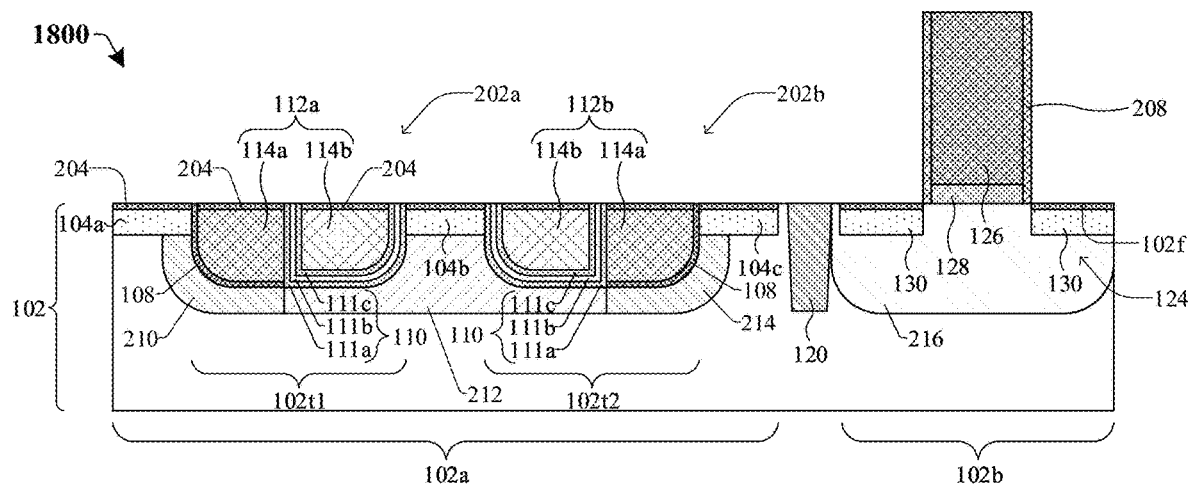

As shown in cross-sectional view 1800 of FIG. 18, an annealing process is performed on the structure of FIG. 17 to form a plurality of silicide layers 204 on the first, second, and third source/drain regions 104a, 104b, 104c, the first and second gate structures 112a, 112b, and the pair of source/drain regions 130. In various embodiments, the silicide layers 204 may, for example, be or comprise nickel silicide, titanium silicide, copper silicide, cobalt silicide, another silicide, or the like. In various embodiments, the silicide layers 204 are concurrently formed within the memory region 102a and the logic region 102b. For example, a first subset of the silicide layers 204 are formed over structure(s) and/or region(s) (e.g., the first, second, and third source/drain regions 104a, 104b, 104c, and/or the first and second gate structures 112a, 112b) of the first and second memory cells 202a, 202b while concurrently forming a second subset of the silicide layers 204 over structure(s) and/or region(s) (e.g., the pair of source/drain regions 130) of the logic device 124. In various embodiments, by concurrently forming the silicide layers 204 within the memory region 102a and the logic region 102b, costs and time associated with fabricating the integrated chip comprising the memory cells 202a, 202b and the logic device 124 may be reduced.

Figure 19:
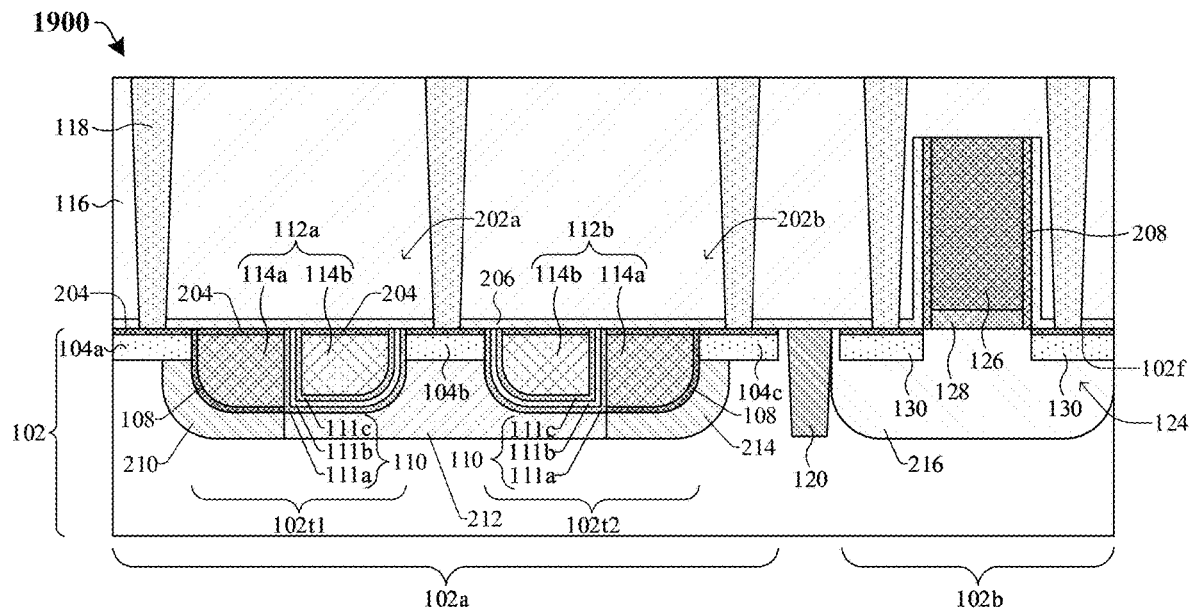

As shown in cross-sectional view 1900 of FIG. 19, a contact etch stop layer (CESL) 206 is formed over the substrate 102 and an inter-level dielectric (ILD) layer 116 is formed over the CESL 206. Further, a plurality of conductive vias 118 are formed within the ILD layer 116 over the memory cells 202a, 202b and the logic device 124. In various embodiments, the CESL 206 and/or the ILD layer 116 may, for example, be formed by a CVD process, a PVD process, an ALD process, or another suitable deposition or growth process.

Figure 20:
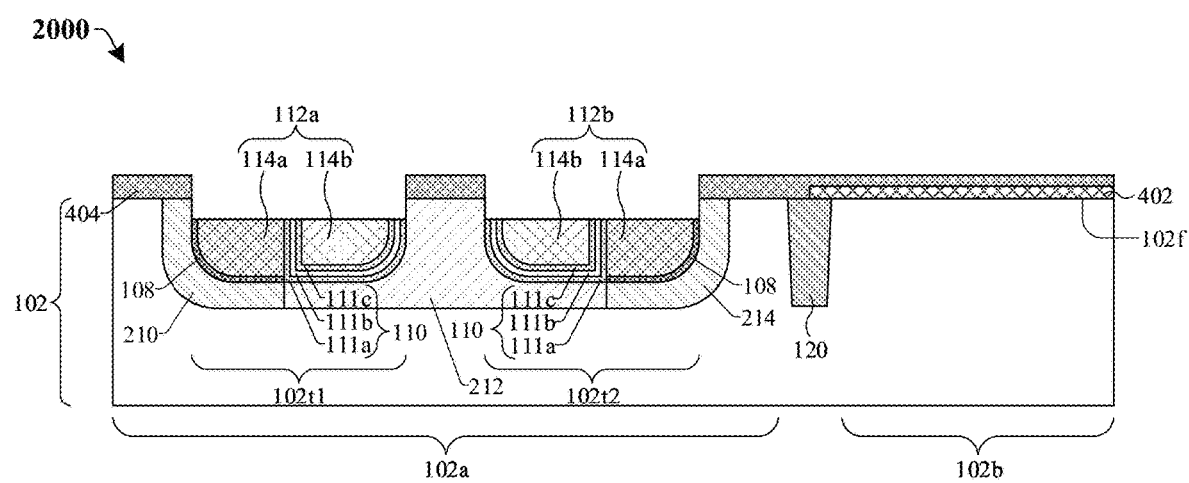
FIGS. 20-21 illustrate cross-sectional views of some embodiments of a second method for forming an integrated chip having gate structures disposed within trenches of a substrate and a logic device disposed on the substrate.
Figure 21:
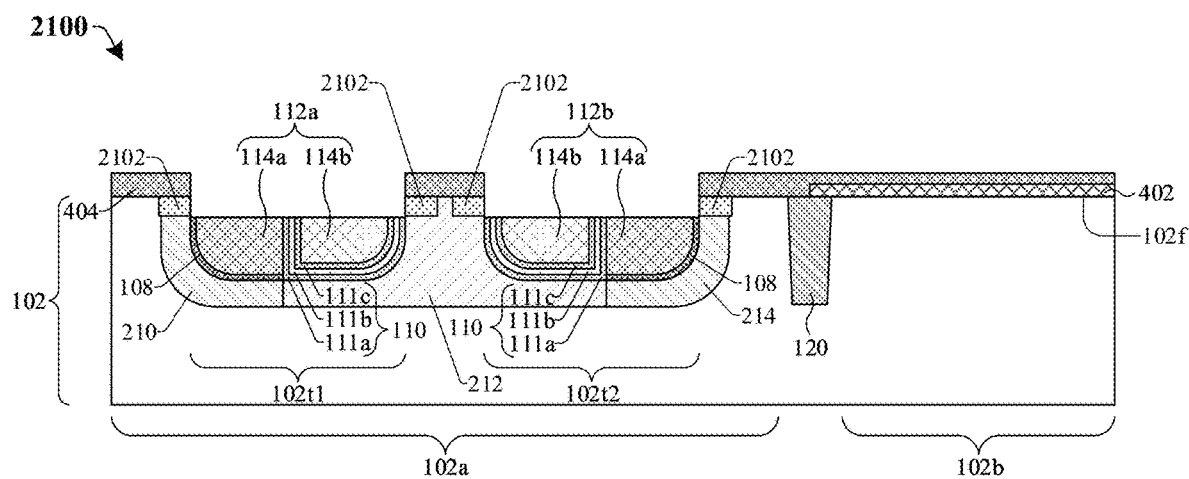

FIGS. 20-21 illustrate cross-sectional views 2000-2100 of some embodiments of a second method for forming an integrated chip having gate structures disposed within trenches and a logic device laterally adjacent to the gate structures. For example, FIGS. 20-21 illustrate alternative embodiments of acts that may be performed after the acts at FIG. 13 and before the acts at FIG. 14 of the method of FIGS. 3-19. Thus, in some embodiments, the second method includes a method that alternatively proceeds from FIGS. 3-13 to FIGS. 20-21, and from FIG. 21 to FIGS. 14-19.

As shown in cross-sectional view 2000 of FIG. 20, an etching process is performed on the first gate structure 112a, the second gate structure 112b, the gate dielectric layer 108, and the charge trapping dielectric structure 110. In various embodiments, the etching process includes performing a dry etch process, a wet etch process, another suitable etch process, or any combination of the foregoing. In further embodiments, a removal process may be performed before the etching process to remove the first and fourth dielectric structures (e.g., 902a, 902d of FIG. 13) from above the first and second gate structures 112a, 112b. In yet further embodiments, after the etching process, top surfaces of the first and second gate structures 112a, 112b may be coplanar with one another and may be disposed vertically below the front-side surface 102f of the substrate 102. Further, the top surface of the gate dielectric layer 108 and the top surface of the charge trapping dielectric structure 110 are coplanar with the top surfaces of the first and second gate structures 112a, 112b and are disposed vertically below the front-side surface 102f of the substrate 102.

As shown in cross-sectional view 2100 of FIG. 21, lightly doped source/drain regions 2102 are formed along sidewalls of the substrate 102 that define the first and second trenches 102t1, 102t2. In various embodiments, a process for forming the lightly doped source/drain regions 2102 include disposing dopants at an angle relative to the front-side surface 102f of the substrate 102 to implant the dopants into exposed segments of the sidewalls of the substrate 102. In various embodiments, first, second, and third source/drain regions (e.g., 104a, 104b, 104c of FIG. 15) may be formed by disposing dopants at an angle relative to the front-side surface 102f of the substrate 102 to implant the dopants into the exposed segments of the sidewalls of the substrate 102 after forming the lightly doped source/drain regions 2102. In some embodiments, by virtue of the top surfaces of the gate dielectric layer 108 and the charge trapping dielectric structure 110 being disposed below the front-side surface 102f of the substrate, damage to the gate dielectric layer 108 and the charge trapping dielectric structure 110 during formation of the lightly doped source/drain regions 2102 and/or the first, second, and third source/drain regions (e.g., 104a, 104b, 104c of FIG. 15) may be mitigated. This, in part, is because the gate dielectric layer 108 and the charge trapping dielectric structure 110 are offset from regions of substrate 102 in which the lightly doped source/drain regions 2102 are formed, thereby reducing an ability for the dopants to bombard and/or be implanted within the gate dielectric layer 108 and the charge trapping dielectric structure 110. Thus, a reliability and endurance of the gate dielectric layer 108 and the charge trapping dielectric structure 110 are increased.

Figure 22:
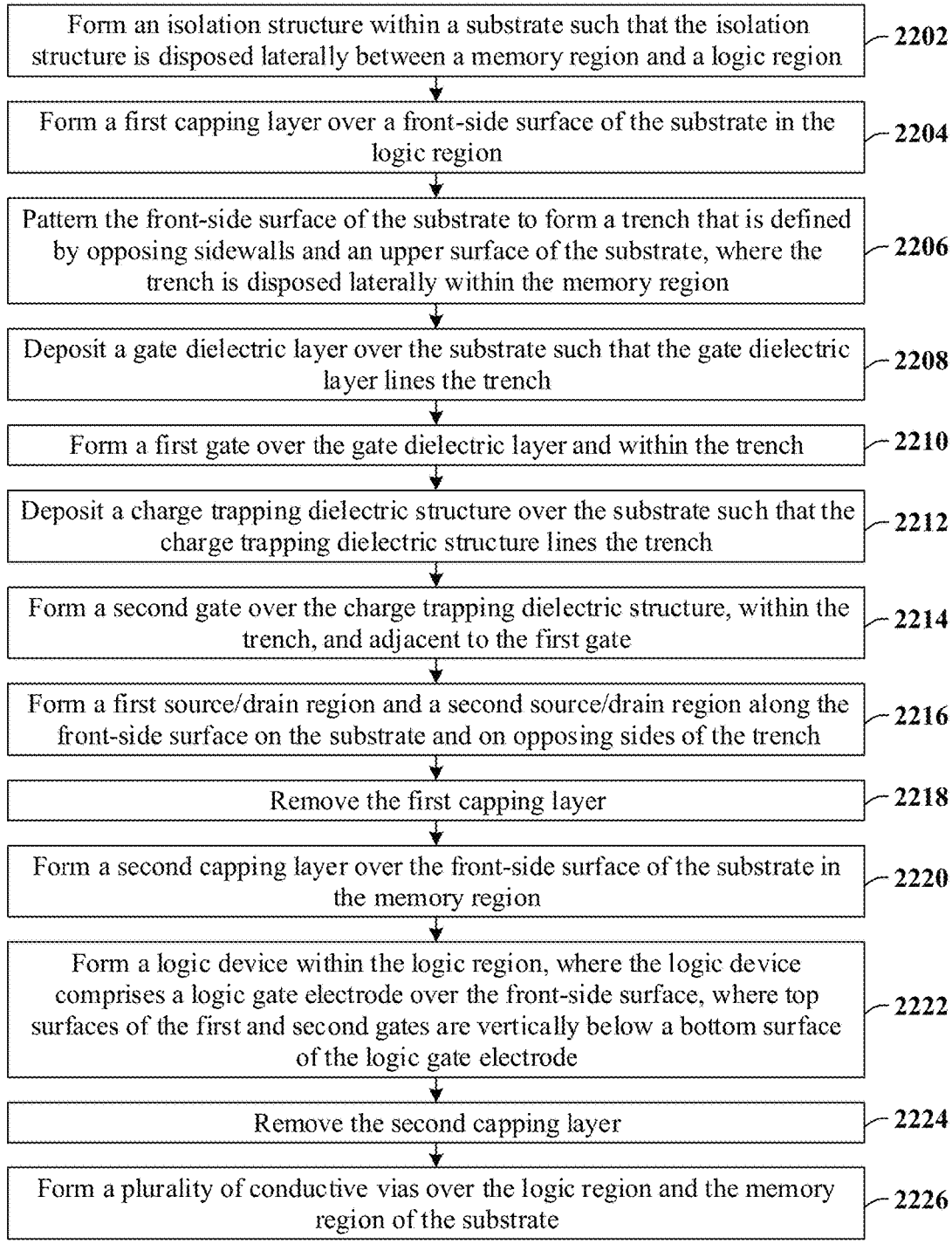
FIG. 22 illustrates a flow diagram of some embodiments of a method for forming an integrated chip having gate structures disposed within trenches of a substrate and a logic device disposed on the substrate.

FIG. 22 illustrates a method 2200 of forming an integrated chip having gate structures disposed within trenches and a logic device laterally adjacent to the gate structures according to the present disclosure. Although the method 2200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, an isolation structure is formed within a substrate such that the isolation structure is disposed laterally between a memory region and a logic region. FIG. 3 illustrates a cross-sectional view 300 corresponding to some embodiments of act 2202.

At act 2204, a first capping layer is formed over a front-side surface of the substrate in the logic region. FIG. 4 illustrates a cross-sectional view 400 corresponding to some embodiments of act 2204.

At act 2206, the front-side surface of the substrate is patterned to form a trench that is defined by opposing sidewalls and an upper surface of the substrate. The trench is disposed laterally within the memory region. FIG. 4 illustrates a cross-sectional view 400 corresponding to some embodiments of act 2206.

At act 2208, a gate dielectric layer is deposited over the substrate such that the gate dielectric layer lines the trench. FIG. 5 illustrates a cross-sectional view 500 corresponding to some embodiments of act 2208.

At act 2210, a first gate is formed over the gate dielectric layer and within the trench. FIGS. 6-11 illustrate cross-sectional views 600-1100 corresponding to some embodiments of act 2210.

At act 2212, a charge trapping dielectric structure is formed over the substrate such that the charge trapping dielectric structure lines the trench. FIG. 12 illustrates a cross-sectional view 1200 corresponding to some embodiments of act 2212.

At act 2214, a second gate is formed over the charge trapping dielectric structure, within the trench, and adjacent to the first gate. FIGS. 12-13 illustrate cross-sectional views 1200-1300 corresponding to some embodiments of act 2214.

At act 2216, a first source/drain region and a second source/drain region are formed along the front-side surface of the substrate and on opposing sides of the trench. FIG. 15 illustrates a cross-sectional view 1500 corresponding to some embodiments of act 2216.

At act 2218, the first capping layer is removed. FIG. 15 illustrates a cross-sectional view 1500 corresponding to some embodiments of act 2218.

At act 2220, a second capping layer is formed over the front-side surface of the substrate in the memory region. FIG. 16 illustrates a cross-sectional view 1600 corresponding to some embodiments of act 2220.

At act 2222, a logic device is formed within the logic region. The logic device comprises a logic gate electrode over the front-side surface, where top surfaces of the first and second gates are vertically below a bottom surface of the logic gate electrode. FIG. 16 illustrates a cross-sectional view 1600 corresponding to some embodiments of act 2222.

At act 2224, the second capping layer is removed. FIG. 16 illustrates a cross-sectional view 1600 corresponding to some embodiments of act 2224.

At act 2226, a plurality of conductive vias is formed over the logic region and the memory region of the substrate. FIG. 19 illustrates a cross-sectional view 1900 corresponding to some embodiments of act 2226.

Accordingly, in some embodiments, the present disclosure relates to an integrated chip including a memory cell that comprises a gate structure disposed within a recess in a substrate and a logic device disposed along the substrate and laterally offset from the gate structure by an isolation structure.

Accordingly, in some embodiments, the present disclosure relates to an integrated chip including a substrate comprising a first pair of opposing sidewalls that define a trench, wherein the trench extends into a front-side surface of the substrate; a first source/drain region disposed along the front-side surface of the substrate; a second source/drain region disposed along the front-side surface of the substrate; and a gate structure disposed within the trench and arranged laterally between the first source/drain region and the second source/drain region, wherein the gate structure extends along the first pair of opposing sidewalls to an upper surface of the substrate, wherein a bottom surface of the gate structure is disposed below a bottom surface of the first source/drain region.

In other embodiments, the present disclosure relates to an integrated chip including a substrate having a memory region laterally adjacent to a logic region, wherein the substrate comprises a first pair of opposing sidewalls defining a first trench and a second pair of opposing sidewalls defining a second trench within the memory region; a plurality of source/drain regions disposed along a front-side surface of the substrate, wherein the plurality of source/drain regions comprises a common source/drain region disposed laterally between the first trench and the second trench; a first gate structure disposed within the first trench; a second gate structure disposed within the second trench, wherein the first and second gate structures respectively comprise a first gate and a second gate laterally adjacent to the first gate; and a logic device disposed within the logic region, wherein the logic device comprises a logic gate dielectric layer over the substrate and a logic gate electrode overlying the logic gate dielectric layer; wherein top surfaces of the first and second gate structures are vertically below a bottom surface of the logic gate electrode.

In yet other embodiments, the present disclosure relates to a method for forming an integrated chip, the method includes patterning a front-side surface of a substrate to define a trench extending into the front-side surface; depositing a gate dielectric layer over the substrate such that the gate dielectric layer lines the trench; forming a first gate over the gate dielectric layer and within the trench such that a bottom surface of the first gate is disposed below the front-side surface; depositing a charge trapping dielectric structure within the trench and along the first gate; forming a second gate over the charge trapping dielectric structure and within the trench such that the second gate is adjacent to the first gate; forming a first source/drain region along the front-side surface; and forming a second source/drain region along the front-side surface, wherein the first and second source/drain regions are disposed on opposing sides of the trench; wherein bottom surfaces of the first and second gates are disposed vertically below a bottom surface of the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a substrate comprising a first pair of opposing sidewalls that define a trench, wherein the trench extends into a front-side surface of the substrate;
   a first source/drain region disposed along the front-side surface of the substrate;
   a second source/drain region disposed along the front-side surface of the substrate; and
   a gate structure disposed within the trench and arranged laterally between the first source/drain region and the second source/drain region, wherein the gate structure fills the trench and extends along the first pair of opposing sidewalls to an upper surface of the substrate, wherein a bottom surface of the gate structure is disposed below a bottom of the first source/drain region, wherein the gate structure comprises a first gate, a second gate adjacent to the first gate, and a dielectric structure, wherein the dielectric structure continuously laterally extends from an outer sidewall of the first gate to an outer sidewall of the second gate.

2. The integrated chip of claim 1, wherein the first pair of opposing sidewalls comprises a first sidewall opposite a second sidewall, wherein the first source/drain region extends along the first sidewall and the second source/drain region extends along the second sidewall.

3. The integrated chip of claim 2, wherein the first and second sidewalls respectively comprise a straight sidewall segment vertically above a curved sidewall segment, wherein the gate structure continuously extends from the straight sidewall segment to the curved sidewall segment of the first and second sidewalls.

4. The integrated chip of claim 1, wherein a top surface of the gate structure is aligned with the front-side surface of the substrate.

5. The integrated chip of claim 1, wherein a top surface of the gate structure is vertically below the front-side surface of the substrate.

6. The integrated chip of claim 1, further comprising:
a semiconductor device disposed on the front-side surface of the substrate and laterally offset from the gate structure, wherein the semiconductor device comprises a gate electrode, a gate dielectric layer disposed between the gate electrode and the front-side surface of the substrate, and a pair of source/drain regions disposed within the substrate on opposing sides of the gate electrode, wherein a top surface of the gate structure is disposed vertically below a bottom surface of the gate electrode.

7. The integrated chip of claim 6, further comprising:
an isolation structure extending into the front-side surface of the substrate and laterally between the gate structure and the semiconductor device, wherein the top surface of the gate structure is disposed vertically below a top surface of the isolation structure.

8. An integrated chip, comprising:
a substrate having a memory region laterally adjacent to a logic region, wherein the substrate comprises a first pair of opposing sidewalls defining a first trench and a second pair of opposing sidewalls defining a second trench within the memory region;
a plurality of source/drain regions disposed along a front-side surface of the substrate, wherein the plurality of source/drain regions comprises a common source/drain region disposed laterally between the first trench and the second trench;
a first gate structure disposed within the first trench;
a second gate structure disposed within the second trench, wherein the first and second gate structures respectively comprise a first gate and a second gate laterally adjacent to the first gate, wherein a top surface of the first gate and a top surface of the second gate are aligned; and
a logic device disposed within the logic region, wherein the logic device comprises a logic gate dielectric layer over the substrate and a logic gate electrode overlying the logic gate dielectric layer;
wherein top surfaces of the first and second gate structures are vertically below a bottom surface of the logic gate electrode.

9. The integrated chip of claim 8, wherein a top surface of the common source/drain region is disposed vertically above the top surfaces of the first and second gate structures.

10. The integrated chip of claim 8, wherein the first gate and the second gate comprise polysilicon and the logic gate electrode comprises a metal material.

11. The integrated chip of claim 8, further comprising:
a first charge trapping dielectric structure disposed between the substrate and the second gate of the first gate structure, wherein the first charge trapping dielectric structure is U-shaped.

12. The integrated chip of claim 11, wherein a top surface of the first charge trapping dielectric structure is disposed below a top surface of the logic gate dielectric layer.

13. The integrated chip of claim 8, further comprising:
an isolation structure extending into the front-side surface of the substrate and disposed laterally between the memory region and the logic region;
wherein a bottom surface of the first gate structure is disposed vertically between a bottom surface of the common source/drain region and a bottom surface of the isolation structure.

14. An integrated chip, comprising:
a substrate comprising a recess extending into a first surface of the substrate;
a pair of source/drain regions disposed on opposing sides of the recess;
a first gate structure disposed within the recess, wherein the first gate structure comprises a first gate and a second gate laterally offset from the first gate by a non-zero distance;
a gate dielectric layer disposed along a first sidewall and a lower surface of the first gate; and
a charge trapping dielectric structure disposed along opposing sidewalls and a lower surface of the second gate.

15. The integrated chip of claim 14, wherein the charge trapping dielectric structure continuously extends from the second gate to a second sidewall of the first gate.

16. The integrated chip of claim 15, wherein the non-zero distance is equal to a thickness of the charge trapping dielectric structure.

17. The integrated chip of claim 14, wherein a top surface of the gate dielectric layer is coplanar with a top surface of the charge trapping dielectric structure.

18. The integrated chip of claim 14, wherein a width of the charge trapping dielectric structure is greater than a width of the gate dielectric layer.

19. The integrated chip of claim 1, wherein a top surface of the first gate and a top surface of the second gate are aligned with or vertically below the front-side surface of the substrate.

20. The integrated chip of claim 1, wherein a height of the dielectric structure is greater than a height of the second gate.

* * * * *